United States Patent
Zhou et al.

(10) Patent No.: US 11,610,944 B2
(45) Date of Patent: Mar. 21, 2023

(54) PIXEL UNIT, METHOD OF MANUFACTURING THE PIXEL UNIT, DISPLAY PANEL AND DISPLAY DEVICE COMPRISING PLURALITY OF SUB PIXELS WITH DIFFERENT CATHODE LAYER THICKNESS

(71) Applicants: Chengdu BOE Optoelectronics Technology Co., Ltd., Sichuan (CN); BOE Technology Group Co., Ltd., Beijing (CN)

(72) Inventors: Weilong Zhou, Beijing (CN); Han Nie, Beijing (CN)

(73) Assignees: Chengdu BOE Optoelectronics Technology Co., LTD., Sichuan (CN); BOE Technology Group Co., LTD., Beijing (CN)

( * ) Notice: Subject to any disclaimer, the term of this patent is extended or adjusted under 35 U.S.C. 154(b) by 236 days.

(21) Appl. No.: 16/966,523

(22) PCT Filed: Feb. 10, 2020

(86) PCT No.: PCT/CN2020/074609
§ 371 (c)(1),
(2) Date: Jul. 31, 2020

(87) PCT Pub. No.: WO2020/186938
PCT Pub. Date: Sep. 24, 2020

(65) Prior Publication Data
US 2021/0225952 A1    Jul. 22, 2021

(30) Foreign Application Priority Data
Mar. 18, 2019    (CN) .......................... 201910205389.6

(51) Int. Cl.
*H01L 27/32* (2006.01)
*H01L 51/52* (2006.01)

(52) U.S. Cl.
CPC ...... *H01L 27/3211* (2013.01); *H01L 51/5218* (2013.01); *H01L 51/5221* (2013.01); *H01L 51/5265* (2013.01); *H01L 51/5268* (2013.01)

(58) Field of Classification Search
CPC combination set(s) only.
See application file for complete search history.

(56) References Cited

U.S. PATENT DOCUMENTS

| 8,593,056 B2 | 11/2013 | Domoto |
| 2005/0249972 A1 | 11/2005 | Hatwar et al. |

(Continued)

FOREIGN PATENT DOCUMENTS

| CN | 1549659 A | 11/2004 |
| CN | 1941401 B | 5/2010 |

(Continued)

OTHER PUBLICATIONS

International search report of PCT application No. PCT/CN2020/074609 dated Apr. 22, 2020.

(Continued)

*Primary Examiner* — Daniel Whalen
(74) *Attorney, Agent, or Firm* — Fay Sharpe LLP

(57) ABSTRACT

A pixel unit, comprising a plurality of sub-pixels of different colors, wherein each of the sub-pixels comprises a first electrode layer, a second electrode layer, and a light-emitting layer disposed between the first electrode layer and the second electrode layer; and in the plurality of sub-pixels of the different colors, an interference intensity of light emitted by the light-emitting layer of the sub-pixel of a target color is greater than an interference intensity of light emitted by the light-emitting layers of the sub-pixels of other colors;

(Continued)

wherein the interference intensity means an interference intensity between reflected light produced when light emitted by the light-emitting layer of the sub-pixel is frequently reflected between the layers of the sub-pixel.

15 Claims, 15 Drawing Sheets

(56) References Cited

U.S. PATENT DOCUMENTS

| | | | |
|---|---|---|---|
| 2007/0069996 | A1 | 3/2007 | Kuba et al. |
| 2014/0312339 | A1* | 10/2014 | Fujita ................. H01L 27/3211 257/40 |
| 2019/0296092 | A1 | 9/2019 | Zhou |
| 2020/0075693 | A1* | 3/2020 | Polyakov ............ H01L 27/3246 |

FOREIGN PATENT DOCUMENTS

| | | | |
|---|---|---|---|
| CN | 103928624 | A | 7/2014 |
| CN | 107154415 | A | 9/2017 |
| CN | 107658331 | A | 2/2018 |
| CN | 107731884 | A | 2/2018 |
| CN | 208489238 | U | 2/2019 |
| CN | 109904348 | A | 6/2019 |

OTHER PUBLICATIONS

First office action of Chinese application No. 201910205389.6 dated Mar. 3, 2020.
Second office action of Chinese application No. 201910205389.6 dated Jul. 21, 2020.

\* cited by examiner

PIXEL UNIT, METHOD OF MANUFACTURING THE PIXEL UNIT, DISPLAY PANEL AND DISPLAY DEVICE COMPRISING PLURALITY OF SUB PIXELS WITH DIFFERENT CATHODE LAYER THICKNESS

The present disclosure is a 371 of PCT Application No. PCT/CN2020/074609, filed on Feb. 10, 2020, which claims priority to Chinese Patent Application No. 201910205389.6, filed on Mar. 18, 2019 and entitled "Pixel unit, display panel and display device", the entire contents of which are incorporated herein by reference.

TECHNICAL FIELD

The present discourse relates to the field of display technologies, and more particularly to a pixel unit, a method for manufacturing the pixel unit, a display panel and a display device.

BACKGROUND

The display panel includes a plurality of OLED (Organic Light Emitting Diode) pixel units, each of which includes a plurality of sub-pixels of different colors, and each sub-pixel includes an anode layer, a light-emitting layer and a cathode layer.

SUMMARY

The present disclosure provides a pixel unit, a method for manufacturing the pixel unit, a display panel and a display device. The technical solutions are described as follows.

In one aspect, there is provided a pixel unit, including a plurality of sub-pixels of different colors. Each of the sub-pixels includes a first electrode layer, a second electrode layer and a light-emitting layer disposed between the first electrode layer and the second electrode layer;

wherein, in the plurality of sub-pixels of different colors, an interference intensity of light emitted by the light-emitting layer of the sub-pixel of a target color is greater than an interference intensity of light emitted by the light-emitting layers of the sub-pixels of other colors;

wherein the interference intensity means an interference intensity between reflected light produced when light emitted by the light-emitting layer of the sub-pixel is frequently reflected between the layers of the sub-pixel.

Optionally, the interference intensity of the light emitted by the light-emitting layer of each of the sub-pixels is in positive correlation with a thickness of the second electrode layer, and the second electrode layer of the sub-pixel of the target color is thicker than the second electrode layers of the sub-pixels of the other colors.

Optionally, the second electrode layer is a cathode layer.

Optionally, the thickness of the cathode layer of the sub-pixel of the target color ranges from 20 nm to 30 nm; and the thicknesses of the cathode layers of the sub-pixels of the other colors range from 8 nm to 18 nm.

Optionally, the cathode layer of the sub-pixel of the target color includes a first cathode sub-layer and a second cathode sub-layer which are sequentially laminated in a direction distal from the light-emitting layer; and the first cathode sub-layer and the cathode layers of the sub-pixels of the other colors are disposed on a same layer and have a same thickness.

Optionally, the interference intensity of the light emitted by the light-emitting layer of each of the sub-pixels is in negative correlation with a scattering intensity of each film layer in the pixel unit, and the sub-pixels of the other colors further each include a scattering layer; and the scattering layer is disposed between the first electrode layer and the light-emitting layer and configured to scatter the light emitted by the light-emitting layer.

Optionally, the scattering layer is made from carbon nanotubes or silver nano-ions.

Optionally, the first electrode layer includes a transparent electrode layer and a reflective metal layer, and the transparent electrode layer is disposed between the reflective metal layer and the light-emitting layer.

Optionally, the transparent electrode layer is made from an indium tin oxide (ITO), and the reflective metal layer is made of a metal or a metal alloy.

Optionally, a thickness of the transparent electrode layer ranges from 5 nm to 15 nm, and a thickness of the reflective metal layer ranges from 90 nm to 110 nm.

Optionally, the plurality of sub-pixels of the different colors includes a red sub-pixel, a green sub-pixel and a blue sub-pixel; and the sub-pixel of the target color is the red sub-pixel.

Optionally, the light-emitting layer in the red sub-pixel is thicker than the light-emitting layer in the green sub-pixel, and the light-emitting layer in the green sub-pixel is thicker than the light-emitting layer in the blue sub-pixel.

Optionally, each of the sub-pixels further includes an ETL and an HTL;

the ETL is disposed between the second electrode layer and the light-emitting layer; and the HTL is disposed between the light-emitting layer and the first electrode layer.

In another aspect, there is provided a method for manufacturing a pixel unit, the method includes:

providing a base substrate;

forming a plurality of sub-pixels of different colors on the base substrate; wherein each of the sub-pixels includes a first electrode layer, a second electrode layer and a light-emitting layer disposed between the first electrode layer and the second electrode layer, and in the plurality of sub-pixels of different colors, an interference intensity of light emitted by the light-emitting layer of the sub-pixel of a target color is greater than an interference intensity of light emitted by the light-emitting layers of the sub-pixels of the other colors;

wherein the interference intensity means an interference intensity between reflected light produced when light emitted by the light-emitting layer of the sub-pixel is frequently reflected between the layers of the sub-pixel.

Optionally, the interference intensity of the light emitted by the light-emitting layer of each of the sub-pixels is in positive correlation with a thickness of the second electrode layer, and the second electrode layer of the sub-pixel of the target color is thicker than the second electrode layers of the sub-pixels of the other colors.

Optionally, the second electrode layer is a cathode layer, and the cathode layer of the sub-pixel of the target color includes a first cathode sub-layer and a second cathode sub-layer which are sequentially laminated in a direction distal from the light-emitting layer; and the first cathode sub-layer and the cathode layers of the sub-pixels of the other colors are formed by one patterning process.

Optionally, the second electrode layer is a cathode layer; and the cathode layer of the sub-pixel of the target color and the cathode layers of the sub-pixels of the other colors are respectively formed by two patterning processes.

In yet another aspect, there is provided a display panel, including at least one pixel unit as defined in the aforementioned aspect and a driving circuit for the display panel.

Optionally, the display panel includes a plurality of the pixel units arranged in an array.

In still yet another aspect, there is provided a display device, including the display panel as defined in the aforementioned aspect.

BRIEF DESCRIPTION OF THE DRAWINGS

In order to explain the technical solutions in the embodiments of the present disclosure more clearly, the drawings required for the description of the embodiments may be briefly introduced below. Obviously, the drawings in the following description are only some embodiments of the present disclosure. For those of ordinary skill in the art, without paying any creative labor, other drawings may be obtained based on these drawings.

DETAILED DESCRIPTION

Figure 1:
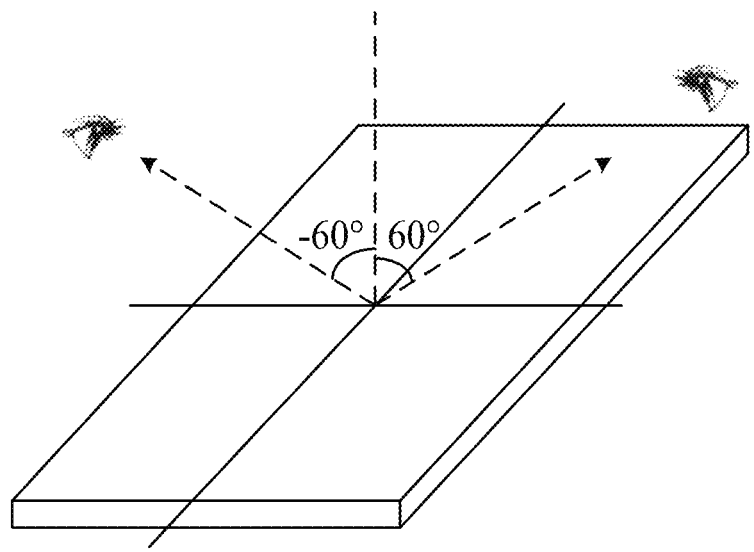
FIG. 1 is a schematic diagram showing changes of color shift with a viewing angle.

For clearer descriptions of the objectives, technical solutions and advantages of the present disclosure, the present disclosure is described in detail below with reference to the accompanying drawings.

In a display panel, each OLED pixel unit may include a plurality of sub-pixels of different colors. The plurality of sub-pixels of different colors display colors of different ratios, such that the pixel unit may display different colors. Each sub-pixel may include an anode layer, a light-emitting layer and a cathode layer. In the related art, a planarization layer may be disposed on the side, distal from the cathode layer, of the anode layer and may make the anode layers of the sub-pixels of various colors in the OLED pixel unit be disposed on the same plane.

It is assumed that each pixel unit includes sub-pixels of three colors (i.e. the three primary colors), namely Red (R), Green (G) and Blue (B). The primary color of R is equivalent to reddish purple with a saturation higher than that of spectral red, the primary color of G is equivalent to green with a saturation higher than that of spectral green of 520 nm, and the primary color of B is equivalent to blue with a saturation higher than that of spectral blue of 477 nm. Stimulus quantities (also called stimulus values) of these three primary colors are represented by X, Y, and Z.

$$X = \int_{380}^{780} \overline{x}(\lambda)\varphi(\lambda)d\lambda, \ Y = \int_{380}^{780} \overline{y}(\lambda)\varphi(\lambda)d\lambda \text{ and } Z = \int_{380}^{780} \overline{z}(\lambda)\varphi(\lambda)d\lambda,$$

which $\overline{x}(\lambda)$, $\overline{y}(\lambda)$ and $\overline{z}(\lambda)$ are three spectral tristimulus values respectively, and $\varphi(\lambda)$ is spectrum. Due to a microcavity effect, the spectra $\varphi(\lambda)$ of red, green and blue, observed by human eyes at different viewing angles, will be different, resulting in changes of the tristimulus values X, Y, and Z.

Under normal circumstances, coordinates of a color may be represented by (x, y), in which x=X/(X+Y+Z), y=Y/(X+Y+Z), x represents the relative magnitude relevant to red, and y represents the relative magnitude relevant to green. In addition, z=Z/(X+Y+Z), in which z represents the relative magnitude relevant to blue, and x+y+z=1. It can be known from the above formula that when the tristimulus values X, Y, and Z change, the coordinates of the color will change, i.e., the color observed by the human eyes changes. That is, when viewed at different angles, the color, observed by the human eyes, of a pixel unit composed of the sub-pixels of red, green, and blue is different from a color actually displayed by the pixel unit, i.e., there exists a color shift.

In the display panel, the planarization layer is usually further disposed on the side, distal from the cathode layer, of the anode layer and may make the anode layers of the sub-pixels of all colors in the OLED pixel unit be disposed on the same plane. However, if the planarization layer has a poor planarization effect, the anode layers of the sub-pixels of different colors will be tilted to different degrees, making that light emitted from the sub-pixels of different colors may be in different directions. As a result, when the pixel unit displays a certain color, the actually observed color observed by the human eyes at different angles and the color displayed by the pixel unit are different, and luminance observed at different angles is also different. That is, the pixel unit will be subject to different degrees of luminance decay and color shift in different directions. Moreover, in the case that the pixel unit displays white, the luminance decays, as well as the color shifts, are more significantly different when the pixel unit is observed by the human eyes at different angles.

For example, as shown in FIG. 1, it is assumed that a straight line perpendicular to the display panel is used as a datum line, and a plane passing through the datum line and parallel to a row direction of the pixel units in the display panel is used as a datum plane. Within this datum plane, a direction in which the datum line rotates clockwise is a positive direction, and a direction in which the datum line rotates counterclockwise is a negative direction. If the pixel units of the display panel display white, the color of the pixel units, observed by the human eyes in a direction that forms an angle of −60° with the datum line, in the display panel may be greenish, and the color of the pixel units, observed by the human eyes in a direction that forms an angle of 60° with the datum line, in the display panel may be reddish. Especially when an edge of the display panel is a curved surface, colors, observed at different angles, of the edge area of the display panel are much different, resulting in poor user experience.

Figure 2:
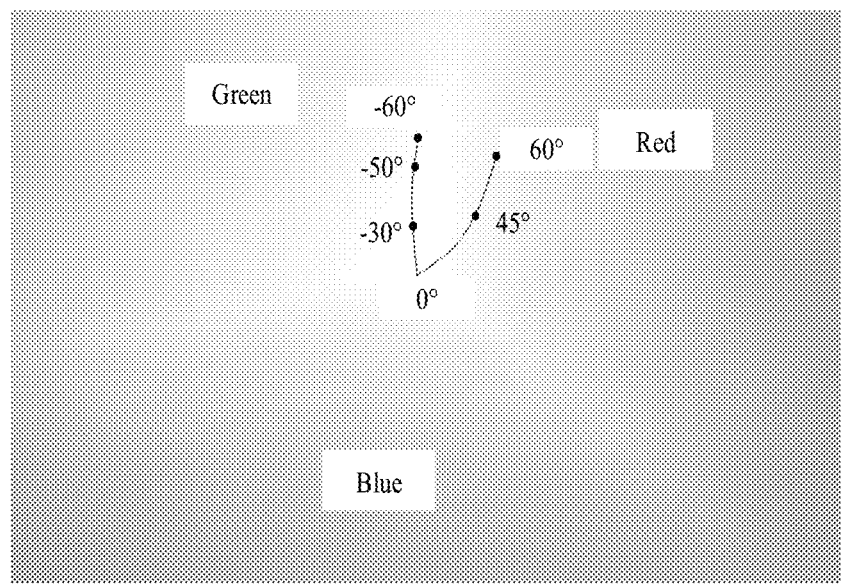
FIG. 2 is a schematic diagram showing a trajectory of changes of color shift with a viewing angle.

FIG. 2 is a schematic diagram of a trajectory of changes of color shift with a viewing angle. FIG. 2 shows a color gamut diagram of a display panel, and a direction of color shift when a viewing direction of the human eyes forms different angles with a datum line. It can be seen with reference to FIG. 2 that when the pixel units in the display panel display white, the color of the pixel unit, observed by the human eyes, becomes more and more greenish with increase of a viewing angle as the human eyes form a negative angle with the datum line, and the color of the pixel unit, observed by the human eyes, becomes more and more reddish with increase of the viewing angle as the human eyes form a positive angle with the datum line. For example, the color observed by the human eyes in a direction that forms an angle of 45° with the datum line is less reddish, and the color observed by the human eyes in a direction that forms an angle of 60° with the datum line is more reddish. That is, the pixel unit has the problem of asymmetry in color shift. As a result, the colors observed by the human eyes at different angles have great difference, and the display panel has a poor display effect.

In the plurality of sub-pixels of different colors, included by each pixel unit, the greater the color shift of the sub-pixel of a certain color is, the smaller the coordinate value of the color displayed by the sub-pixel of that color in color coordinates is, and the smaller the ratio of the color displayed by the sub-pixel of that color in the color displayed by the pixel unit is, and thereof the less the color displayed by the sub-pixel of that color influences the color displayed by the pixel unit.

Figure 3:
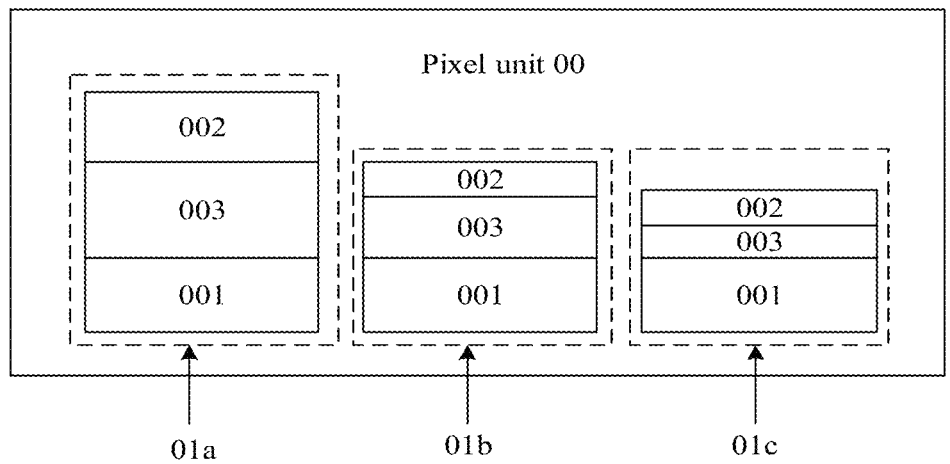
FIG. 3 is a schematic structural diagram of a pixel unit in accordance with an embodiment of the present disclosure.

FIG. 3 is a schematic structural diagram of a pixel unit in accordance with an embodiment of the present disclosure. It can be seen with reference to FIG. 3 that a pixel unit 00 may include a plurality of sub-pixels 01 of different colors. For example, the sub-pixel 00 shown in FIG. 3 includes three sub-pixels 01a, 01b and 01c of different colors. Each sub-pixel 01 may include a first electrode layer 001, a second electrode layer 002 and a light-emitting layer 003 disposed between the first electrode layer 001 and the second electrode layer 002.

In the plurality of sub-pixels 01 of different colors, an interference intensity of light emitted by the light-emitting layer of the sub-pixel of a target color 01a is greater than the interference intensity of light emitted by the light-emitting layers of the sub-pixels of the other colors (e.g., the sub-pixel 01b and the sub-pixel 01c in FIG. 1). The interference intensity means an interference intensity among reflected light produced when light emitted by the light-emitting layer 003 is frequently reflected between film layers of the sub-pixel.

Optionally, in an embodiment of the present disclosure, a microcavity may be formed between two film layers spaced apart in each sub-pixel. For example, the microcavity may be formed between the first electrode layer 001 and the second electrode layer 002. The microcavity intensity of the sub-pixel of the target color may be greater than that of the sub-pixels of the other colors. The microcavity intensity may mean a microcavity intensity between reflected light produced when light emitted by the light-emitting layer 003 is frequently reflected between the two film layers (e.g., the first electrode layer 001 and the second electrode layer 002) that are spaced apart.

A relationship between a spectrum observed by human eyes and the microcavity intensity may meet the following formula:

$$EL(\lambda) = PL(\lambda) \times Gcav(\lambda) \quad \text{Formula (1),}$$

Wherein, $Gcav(\lambda)$ is the microcavity intensity, $PL(\lambda)$ may be an intrinsic spectrum of a material, $EL(\lambda)$ may be the spectrum observed by the human eyes, and $\lambda$ is wavelength. It can be seen from Formula (1) that the microcavity intensity will influence the spectrum observed by the human eyes. As a result, when the pixel unit is observed at different angles, an observed color and a color actually displayed by the pixel unit are different, i.e., there exists a color shift.

It can be known with reference to Formula (1) that the greater the microcavity intensity is (i.e., the greater the interference intensity of light generated by the light-emitting layer is), the more significant the difference between the spectrum observed by the human eyes and the intrinsic spectrum of the material is, and the greater the color shift is; and the smaller the microcavity intensity is (i.e., the smaller the interference intensity of the light emitted by the light-emitting layer is), the smaller the difference between the spectrum observed by the human eyes and the intrinsic spectrum of the material is, and the smaller the color shift is, Therefore, the pixel unit 00 provided by the present embodiment may make the interference intensity of the light emitted by, the light-emitting layer of the sub-pixel of the target color 01a greater, such that the color shift of the sub-pixel of the target color 01a becomes greater. Further, a ratio of the color displayed by the sub-pixel of the target color 01a to the color displayed by the pixel unit 00 may be reduced, thereby reducing the influence on the color displayed by the whole pixel unit 00 from the color displayed by the sub-pixel of the target color 01a. In this way, when observed by the human eyes at different angles, the colors displayed by the pixel unit 00 are all approximate to the color displayed by the sub-pixels of the other colors, such that the colors observed by the human eyes are excellent in consistency.

In summary, the pixel unit provided by the present embodiment includes the plurality of sub-pixels of different colors. In the plurality of sub-pixels of different colors, the interference intensity of light emitted by the light-emitting layer of the sub-pixel of the target color is greater than that of light emitted by light-emitting layers of the sub-pixels of the other colors, such that the color shift of the sub-pixel of the target color may be increased, and the ratio of the color displayed by the sub-pixel of the target color to the color displayed by the pixel unit is reduced. In this way, when observed by the human eyes at different angles, the colors displayed by the pixel unit are all approximate to the color displayed by the sub-pixels of the other colors. Therefore, the observed colors are excellent in consistency, which effectively solves the problem of asymmetry in color shift. Moreover, a display effect of the display panel is improved by adjusting the interference intensity of light emitted by the sub-pixels of different colors. Thus, the manufacturing process is reduced in difficulty and color gamut will not be adversely affected.

Optionally, the interference intensity of the light emitted by the light-emitting layer of each of the sub-pixels is in positive correlation with the thickness of the second electrode layer 002 in the corresponding sub-pixel. Therefore, in the embodiments of the present disclosure, in order to make the interference intensity of the light emitted by the light-emitting layer of the sub-pixel of the target color 01a greater than that of the light emitted by the light-emitting layers of the sub-pixels of the other colors, as an optional implementation, the second electrode layer 002 of the sub-pixel of the target color 01a may be thicker than the second electrode layers 002 of the sub-pixels of the other colors (e.g., the sub-pixel 01b and the sub-pixel 01c). Thus, the color shift of the sub-pixel of the target color 01a may be greater than that of the sub-pixels of the other colors, which ensures that the colors observed by the human eyes at different angles are excellent in consistency, thereby improving the display effect of the display panel.

Optionally, the second electrode layer 002 is a cathode layer. That is, the cathode layer of the sub-pixel of the target color 01a may be thicker than the cathode layers of the sub-pixels of the other colors.

Figure 4:
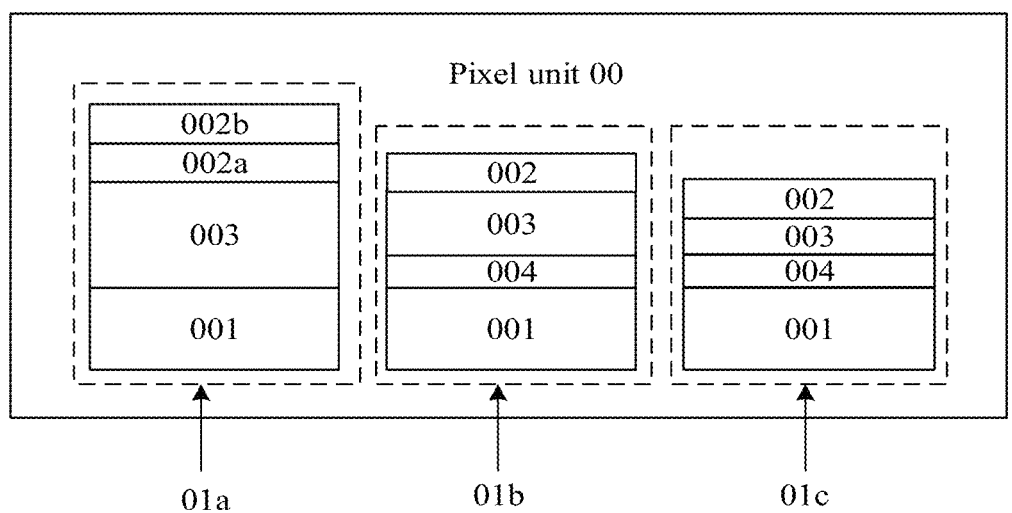
FIG. 4 is a schematic structural diagram of another pixel unit in accordance with an embodiment of the present disclosure.

In an embodiment of the present disclosure, as shown in FIG. 4, the cathode layer in the sub-pixel of the target color 01a may be of a double-layered structure. That is, the cathode layer in the sub-pixel of the target color 01a may include a first cathode sub-layer 002a and a second cathode sub-layer 002b. The first cathode sub-layer 002a and the cathode layers of the sub-pixels of the other colors may be arranged on the same layer and made by one patterning process. Therefore, the thickness of the first cathode sub-layer 002a equals that of the cathode layers of the sub-pixels of the other colors. The second cathode sub-layer 002b (i.e., an additional cathode layer) may be disposed on the side, distal from the first electrode layer 001, of the first cathode sub-layer 002a. The additional cathode layer may be manufactured by an additional Fine Metal Mask (FMM). Since the cathode layer 002 in the sub-pixel of the target color 01a includes the additional cathode layer, the cathode layer of the sub-pixel of the target color 01a may be thicker than the cathode layers of the sub-pixels of the other colors.

Alternatively, in order to make the cathode layer of the sub-pixel of the target color 01a thicker than the cathode layers of the sub-pixels of the other colors, the cathode layers of the sub-pixels of the other colors may also made thinner. For example, the cathode layer of the sub-pixel of the target color 01a and the cathode layers of the sub-pixels of the other colors may be made by two patterning processes. For example, the cathode layer of the sub-pixel of the target color 01a may be manufactured by a first patterning process, and then the cathode layers of the sub-pixels of the other colors may be manufactured by a second patterning process, such that the cathode layers of the two have different thicknesses. Certainly, the order of the first patterning process and the second patterning process may be adjusted, which is not limited in the embodiments of the present disclosure.

Figure 5:
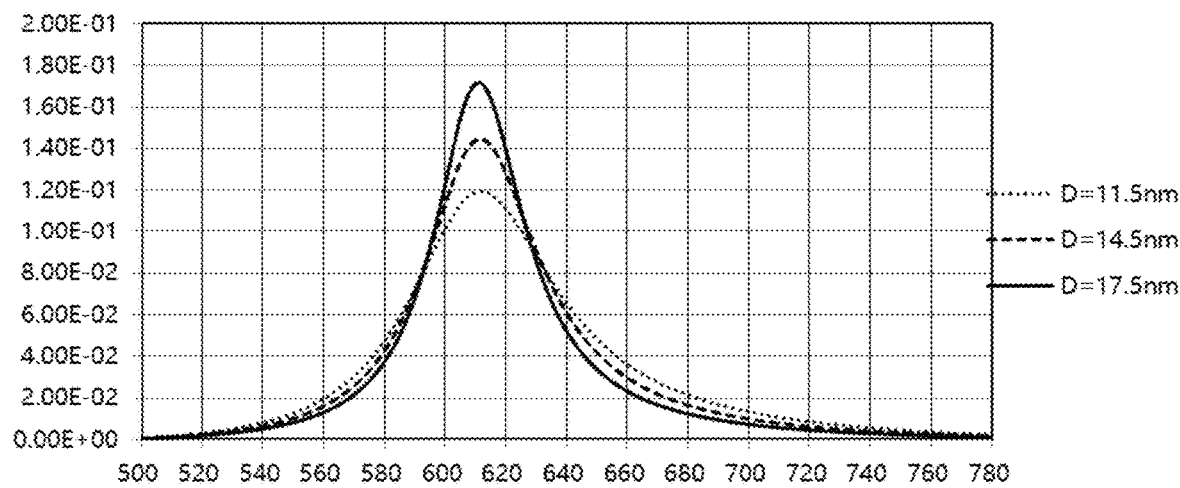
FIG. 5 is a graph showing a relationship between a microcavity gain factor and a wavelength in accordance with an embodiment of the present disclosure.

FIG. 5 is a graph showing a relationship between a microcavity gain factor and a wavelength in accordance with an embodiment of the present disclosure. The horizontal axis represents wavelength, which may be in nanometer (nm); and the vertical axis represents the microcavity gain factor, which may be in an arbitrary unit (a.u.). In the sub-pixel, the microcavity intensity is in positive correlation with the microcavity gain factor. FIG. 5 shows the relationship between the microcavity gain factor and the wavelength when the thickness D of the cathode layer of the sub-pixel is 11.5 nm, 14.5 nm and 17.5 nm respectively, in which 2.00E-01 means 2.00 times 10 to the power of minus one (i.e., $2.00 \times 10^{-1}$).

It can be seen with reference to FIG. 5 that when the wavelength is constant, the greater the thickness D of the cathode layer of the sub-pixel is, the greater the microcavity gain factor is, and the greater the microcavity intensity of the sub-pixel is, i.e., the greater the interference intensity of the light emitted by the light-emitting layer of the sub-pixel is. For example, when the wavelength is 610 nm, the microcavity gain factor of the sub-pixel of which the cathode layer has the thickness D of 17.5 nm ranges from 1.06E-01 to 1.80E-01, the microcavity gain factor of the sub-pixel of which the cathode layer has the thickness D of 14.5 nm ranges from 1.40E-01 to 1.60E-01, and the microcavity gain factor of the sub-pixel of which the cathode layer has the thickness D of 11.5 nm is 1.20E-01.

However, the microcavity intensity is in positive correlation with the microcavity gain factor, i.e., the greater the microcavity gain factor is, the greater the microcavity intensity is, and the smaller the microcavity gain factor is, the smaller the microcavity intensity is. Therefore, the microcavity gain factor of the sub-pixel of the target color 01a may be increased by thickening the cathode layer 002 of the sub-pixel of the target color 01a, thereby increasing the microcavity intensity of the sub-pixel of the target color 01a, i.e., increasing the interference intensity of the light emitted by the light-emitting layer of the sub-pixel of the target color 01a.

Figure 6:
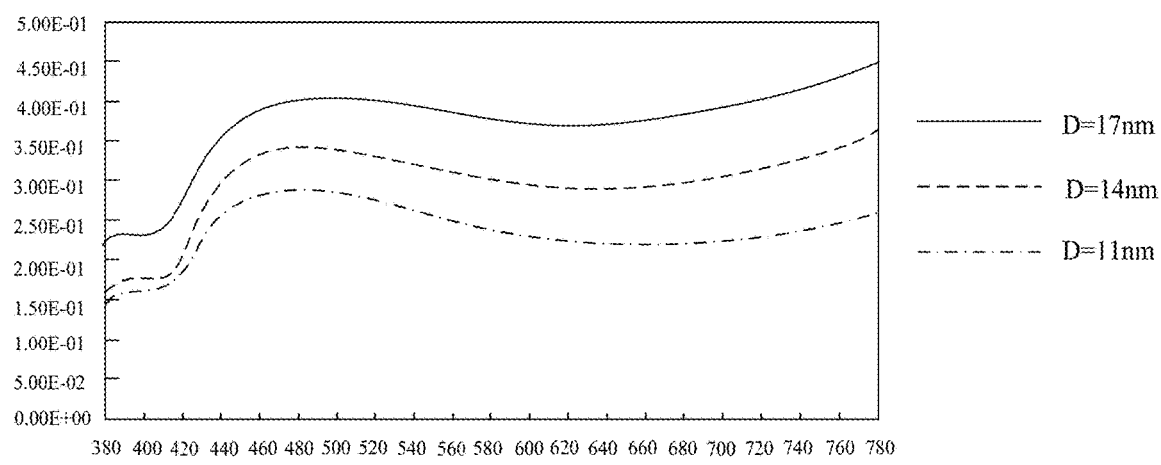
FIG. 6 is a graph showing a relationship between reflectivity of a cathode layer and a wavelength in accordance with an embodiment of the present disclosure.

FIG. 6 is a graph showing a relationship between reflectivity of a cathode layer and wavelength in accordance with an embodiment of the present disclosure. The horizontal axis represents wavelength, which may be in nm; and the vertical axis represents the reflectivity of the cathode layer. In the sub-pixel, the microcavity intensity is in positive correlation with the reflectivity of the cathode layer. FIG. 6 shows the relationship between the reflectivity of the cathode layer and the wavelength when the cathode layer of the sub-pixel has a thickness D of 17 nm, 14 nm and 11 nm respectively, in which the wavelength ranges from 380 nm to 780 nm, and 4.50E-01 means 4.50 times 10 to the power of minus one (i.e., $4.50*10^{-1}$).

It can be seen with reference to FIG. 6 that when the wavelength is constant, the greater the thickness D of the cathode layer of the sub-pixel is, the greater the reflectivity of the cathode layer is, the greater the microcavity intensity of the sub-pixel is, and the greater the interference intensity of the light emitted by the light-emitting layer of the sub-pixel is. For example, in FIG. 6, when the wavelength is 480 nm, the reflectivity of the cathode layer of the sub-pixel of which the cathode layer has a thickness D of 17 nm ranges from 3.50E-01 to 4.00E-01, the reflectivity of the cathode layer of the sub-pixel of which the cathode layer has a thickness D of 14 nm ranges from 3.00E-01 to 3.50E-01, and the reflectivity of the cathode layer of the sub-pixel of which the cathode layer has a thickness D of 11 nm ranges from 2.50E-01 to 3.00E-01.

However, the microcavity intensity is in positive correlation with the reflectivity of the cathode layer, i.e., the greater the reflectivity of the cathode layer is, the greater the microcavity intensity is, and the smaller the reflectivity of the cathode layer is, the smaller the microcavity intensity is. Therefore, the reflectivity of the cathode layer 002 of the sub-pixel of the target color 01a may be increased by thickening the cathode layer 002 of the sub-pixel of the target color 01a, thereby increasing the microcavity intensity of the sub-pixel of the target color 01a, i.e., increasing the interference intensity of the light emitted by the light-emitting layer of the sub-pixel of the target color 01a.

Figure 7:
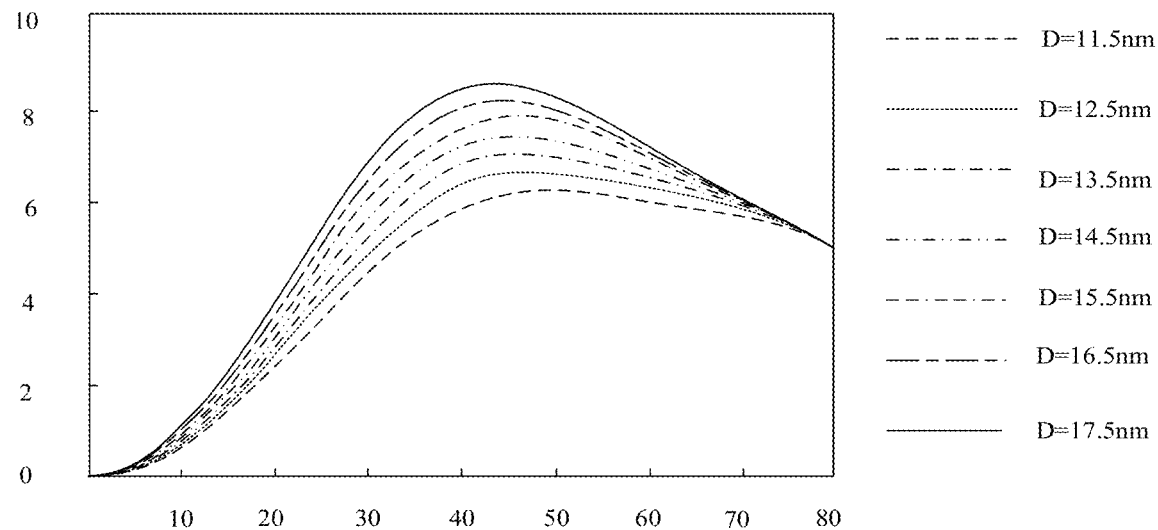
FIG. 7 is a graph showing a relationship between degree of color shift and a viewing angle in accordance with an embodiment of the present disclosure.

FIG. 7 is a graph showing a relationship between the degree of color shift and a viewing angle in accordance with an embodiment of the present disclosure. The horizontal axis represents the viewing angle, which may be in degree (°); and the vertical axis represents the degree of color shift, which may be in just noticeable color difference (JNCD). In the sub-pixel, the degree of color shift is in positive correlation with the microcavity intensity. FIG. 7 shows the relationship between the degree of color shift and the viewing angle when the thickness D of the cathode layer is 11.5 nm, 12.5 nm, 13.5 nm, 14.5 nm, 15.5 nm, 16.5 nm, and 17.5 nm respectively, in which the viewing angle ranges from 0 to 80°.

It can be seen with reference to FIG. 7 that when the viewing angle is constant, the greater the thickness D of the cathode layer is, the greater the color shift is. For example, when the viewing angle is 40°, the color shift of the sub-pixel of which the cathode layer has a thickness D of 17.5 nm is greater, and the color shift of the sub-pixel of which the cathode layer has a thickness D of 11.5 nm is smaller. Therefore, in an embodiment of the present disclosure, the color shift of the sub-pixel of the target color 01a may be increased by thickening the cathode layer 002 of the sub-pixel of the target color 01a, such that the interference intensity of the light emitted by the sub-pixel of the target color 01a becomes greater, and further, a ratio of color displayed by the sub-pixel of the target color 01a to the color displayed by the pixel unit is thereof reduced.

Figure 8:
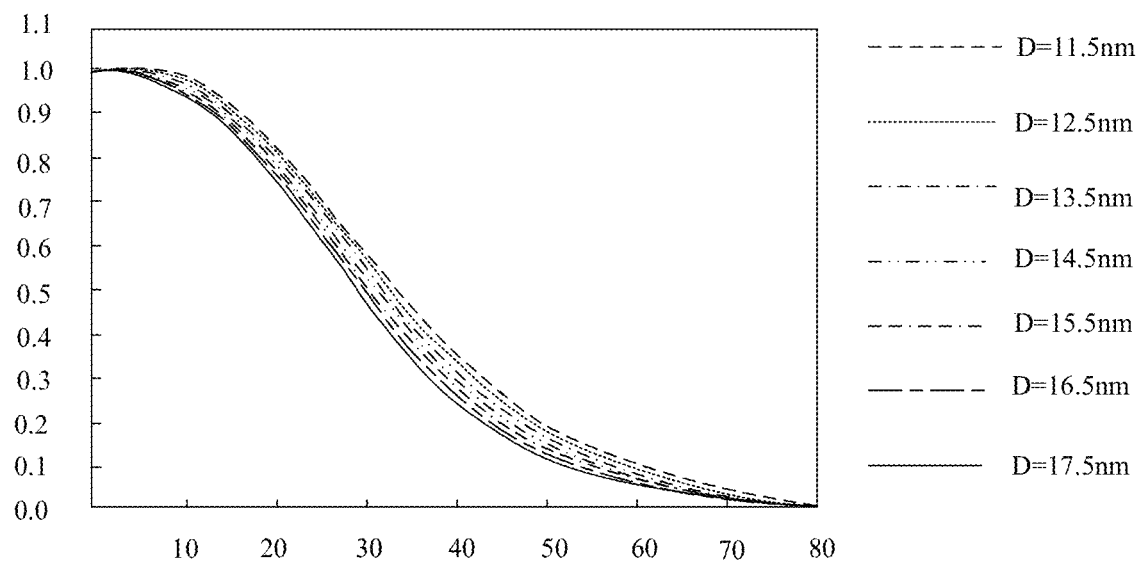
FIG. 8 is a graph showing a relationship between luminance of a sub-pixel and a viewing angle in accordance with an embodiment of the present disclosure.

FIG. 8 is a graph showing a relationship between luminance of a sub-pixel and a viewing angle in accordance with an embodiment of the present disclosure. The horizontal axis represents the viewing angle, which may be in degree; and the vertical axis represents the luminance. The luminance of the sub-pixel is in negative correlation with the microcavity intensity. FIG. 8 shows the relationship between the luminance of the sub-pixel and the viewing angle when the thickness D of the cathode layer is 11.5 nm, 12.5 nm, 13.5 nm, 14.5 nm, 15.5 nm, 16.5 nm and 17.5 nm respectively, in which the viewing angle ranges from 0 to 80°.

It can be seen with reference to FIG. 8 that when the viewing angle is constant, the greater the thickness D of the cathode layer is, the lower the luminance of the sub-pixel is. For example, when the viewing angle is 30°, the luminance of the sub-pixel of which the cathode layer has a thickness D of 17.5 nm is lower, and the luminance of the sub-pixel of which the cathode layer has a thickness D of 11.5 nm is greater. Therefore, in an embodiment of the present disclosure, the luminance of the sub-pixel of the target color 01a may be reduced by increasing the thickness of the cathode layer 002 of the sub-pixel of the target color 01a, such that the microcavity intensity of the sub-pixel of the target color 01a becomes greater, i.e., the interference intensity of the light emitted by the light-emitting layer becomes greater, thereby reducing the influence on the color displayed by the pixel unit from the color displayed by the sub-pixel of the target color 01a.

According to the above analysis, it can be known that the microcavity gain factor of the sub-pixel of the target color 01a may be increased by thickening the cathode layer 022 of the sub-pixel of the target color 01a, so as to improve the interference intensity of the light emitted by the light-emitting layer of the sub-pixel of the target color 01a, In this way, the color shift of the sub-pixel of the target color 01a is relatively great, the luminance is relatively low, and a ratio of the color displayed by the sub-pixel of the target color 01a to the colors displayed by the pixel unit is relatively small.

Optionally, the thickness of the cathode layer 001 of the sub-pixel of the target color 01a may range from 20 nm to 30 nm. The thicknesses of the cathode layers 022 of the sub-pixels of the other colors (e.g., the sub-pixel 01b and the sub-pixel 01c) may range from 8 nm to 18 nm.

In the embodiments of the present disclosure, the plurality of sub-pixels 01 of different colors may include: a red sub-pixel, a green sub-pixel and a blue sub-pixel. The sub-pixel of the target color 01a may be the red sub-pixel. Correspondingly, the sub-pixels of the other colors 01b may be green sub-pixels, and the sub-pixels of the other colors 01c may be blue sub-pixels.

Since the human eyes are most sensitive to the hue of red, in order to improve the display effect of the display panel, the interference intensity of the light emitted by the light-emitting layer of the red sub-pixel in the pixel unit may be increased (i.e., the microcavity intensity of the red sub-pixel becomes greater), such that the color shift of the red sub-pixel becomes greater, and further the ratio of the color displayed by the red sub-pixel to the color displayed by the pixel unit is reduced. When the human eyes observe the display panel at different angles, the colors displayed by the pixel unit may be all greenish. That is, the color shift of the pixel unit is consistent, and the display effect of the display panel is excellent. At the same time, when the interference intensity of the light emitted by the light-emitting layer of the red sub-pixel becomes greater, the luminance of the red sub-pixel will be reduced, such that the influence on the color displayed by the pixel unit from the color displayed by the red sub-pixel may be reduced.

Figure 9:
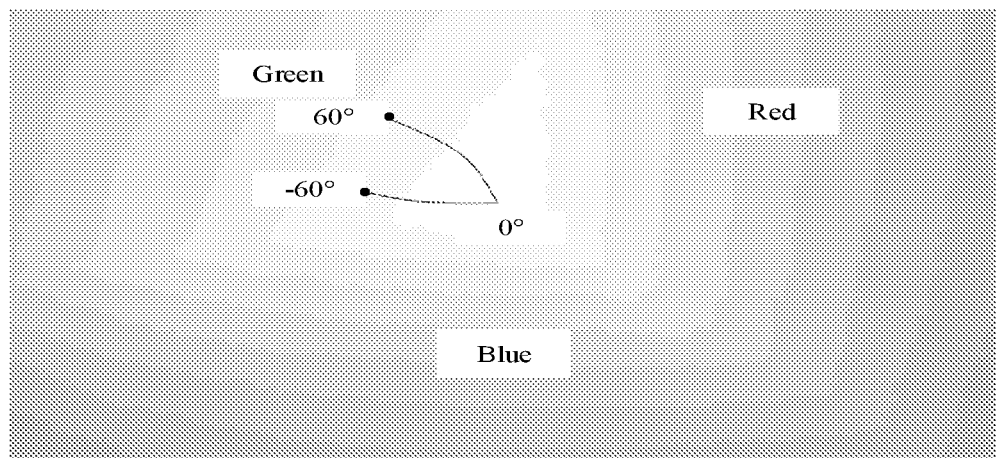
FIG. 9 is a schematic diagram showing a trajectory of changes of color shift of a pixel unit with a viewing angle in accordance with an embodiment of the present disclosure.

Exemplarily, FIG. 9 is a schematic diagram showing a trajectory of changes of color shift of a pixel unit with a viewing angle in accordance with an embodiment of the present disclosure. It is assumed that a straight line perpendicular to the display panel is used as a datum line, and a plane passing through the datum line and parallel to a row direction of the pixel units in the display panel is used as a datum plane. Within this datum plane, a direction in which the datum line rotates clockwise is a positive direction, and a direction in which the datum line rotates counterclockwise is a negative direction. Referring to FIG. 9, the colors observed by the human eyes in the direction that forms an angle of −60° with the datum line and the direction that forms an angle of 60° with the datum line are both greenish. At this time, although the pixel unit is still subject to color shift, the colors of the pixel unit, observed by the human eyes at different angles, are excellent in consistency, and the display effect of the display panel is good.

Figure 10:
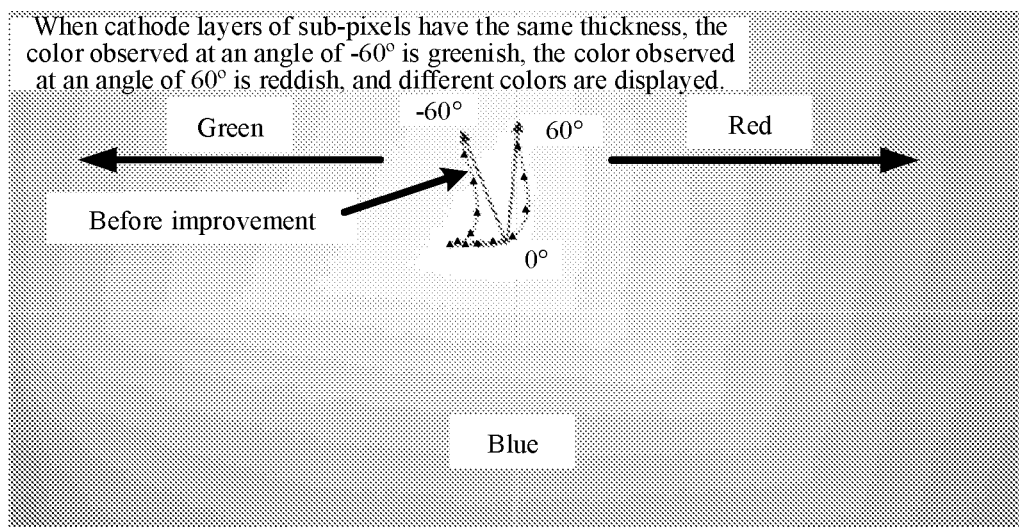
FIG. 10 is a schematic diagram showing a trajectory of changes of color shift with a viewing angle when cathode layers of all sub-pixels in a pixel unit have the same thickness.

FIG. 10 is a schematic diagram showing a trajectory of changes of color shift with a viewing angle when cathode layers of sub-pixels in the pixel unit have the same thickness, i.e., a schematic diagram of a trajectory of changes of color shift of the pixel unit having unimproved color shift symmetry with a viewing angle. It can be seen with reference to FIG. 10 that when the cathode layers 002 of the red sub-pixel 01a, the green sub-pixel 01b, and the blue sub-pixel 01c have the same thickness, the color observed by the human eyes in a direction that forms an angle of −60° with the datum line is greenish, and the color observed by the human eyes in the direction that forms an angle of 60° with the datum line is reddish. That is, when the human eyes observe at different angles, the observed colors are poor in consistency. As a result, the problem of asymmetry in color shift exists, and the display effect of the display panel is poor.

Figure 11:
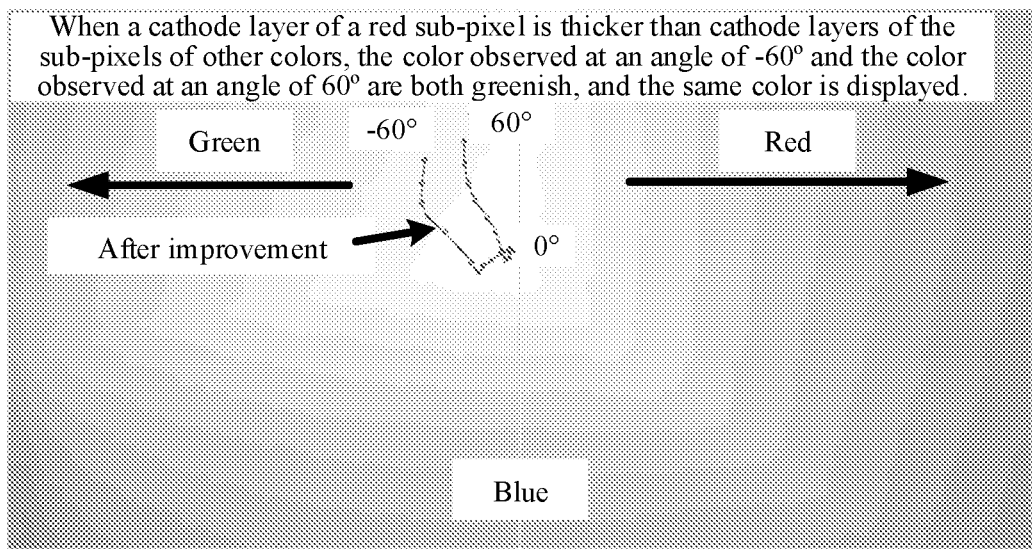
FIG. 11 is a schematic diagram showing a trajectory of changes of color shift with a viewing angle when a cathode layer of a red sub-pixel in a pixel unit is thicker than cathode layers of the sub-pixels of other colors.

FIG. 11 is a schematic diagram showing a trajectory of changes of color shift with a viewing angle when a cathode layer of a red sub-pixel in a pixel unit is thicker than cathode layers of the sub-pixels of the other colors, i.e., a schematic diagram of a trajectory of changes of color shift of the pixel unit having improved color shift symmetry with a viewing angle. It can be seen with reference to FIG. 11 that when the cathode layer 002 of the red sub-pixel 01a is thicker than the cathode layer of the green sub-pixel 01b and the cathode layer of the blue sub-pixel 01c, the colors observed by the human eyes in a direction that forms an angle of −60° with the datum line and the color observed by the human eyes in the direction that forms an angle of 60° with the datum line are both greenish. That is, when the human eyes observe at different angles, the observed colors are excellent in consistency. Thus, the problem of asymmetry in color shift is solved, and the display effect of the display panel is good.

Figure 12:
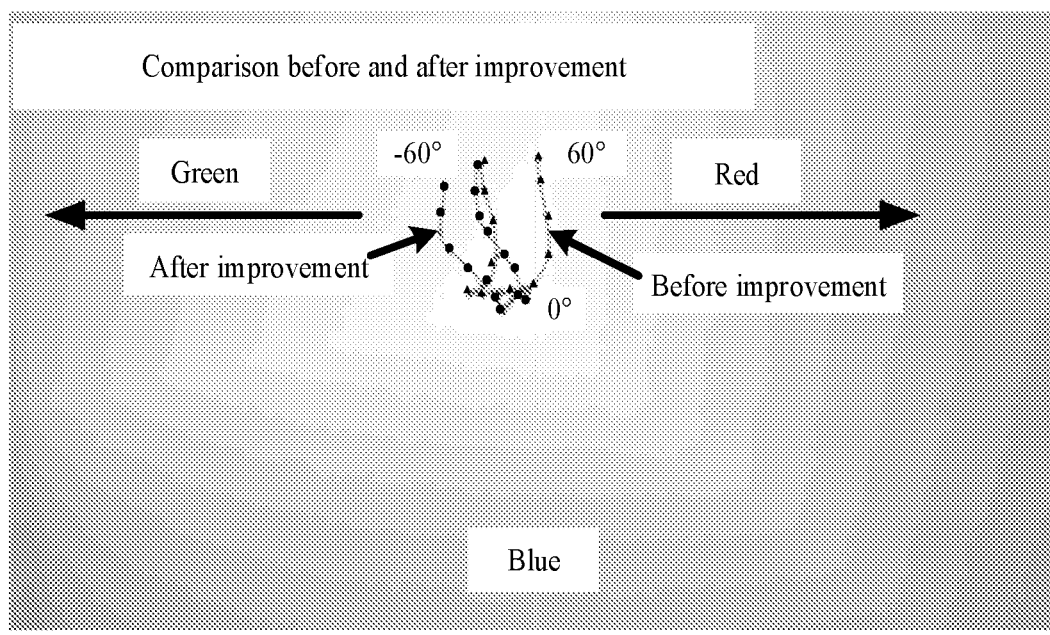
FIG. 12 is a schematic diagram showing comparison between trajectories of changes of color shifts with a viewing angle before and after improvement of a pixel unit.

FIG. 12 is a schematic diagram showing comparison between trajectories of changes of color shift with a viewing angle before and after improvement of a pixel unit. Referring to FIG. 12, when the cathode layer 002 of the red sub-pixel 01a is thicker than the cathode layers of the green sub-pixel 01b and the blue sub-pixel 01c, a ratio of the color displayed by the red sub-pixel 01a to the color displayed by the pixel unit is reduced, and the colors observed by the human eyes at different angles are all greenish. In this way, although the color shift still exists in the pixel unit, the display panel has a better display effect since the problem of asymmetry in color shift of the pixel unit is solved.

Figure 13:
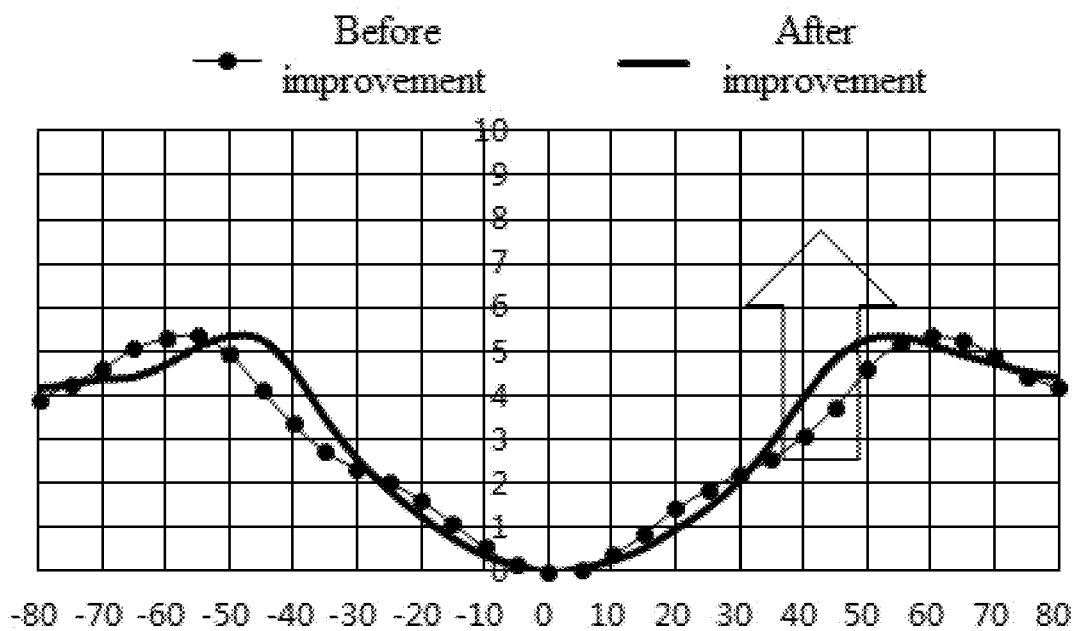
FIG. 13 is a graph showing a relationship between color shift of a red sub-pixel and a viewing angle in accordance with an embodiment of the present disclosure.

FIG. 13 is a graph showing a relationship between color shift of a red sub-pixel and a viewing angle in accordance with an embodiment of the present disclosure. The horizontal axis represents the viewing angle, and the vertical axis represents the degree of color shift. The degree of color shift may be represented in the unit of JNCD. Referring to FIG. 13, when the thickness of the cathode layer 002 of the red sub-pixel 01a is great (i.e., after improvement), the color shift of the red sub-pixel 01a tends to be increased on the whole within the viewing angle of −60° to 60°. That is, when the viewing angle ranges from −60° to 60°, the ratio of the color displayed by the red sub-pixel to the color displayed by the pixel unit is reduced.

Figure 14:
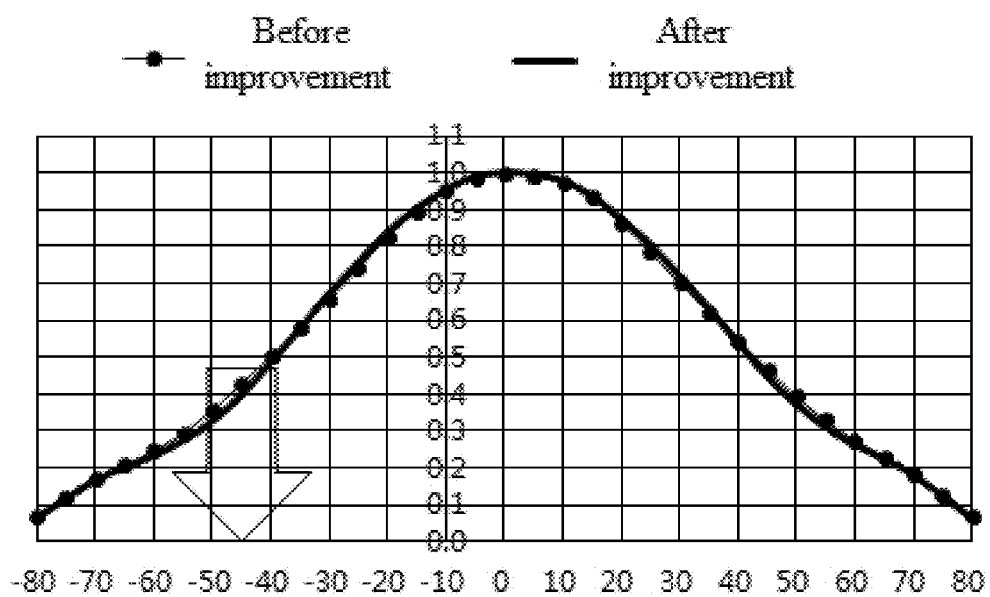
FIG. 14 is a graph showing a relationship between luminance of a red sub-pixel and a viewing angle in accordance with an embodiment of the present disclosure.

FIG. 14 is a graph showing a relationship between luminance of a red sub-pixel and a viewing angle in accordance with an embodiment of the present disclosure. The horizontal axis represents the viewing angle, and the vertical axis represents the luminance. Referring to FIG. 14, when the thickness of the cathode layer 002 of the red sub-pixel 01a is great (i.e., after improvement), the luminance of the red sub-pixel is reduced when the viewing angle ranges from −80° to 80°. That is, the influence on the color displayed by the pixel unit from the color displayed by the red sub-pixel is reduced.

Optionally, the interference intensity of the light emitted by the light-emitting layer of each sub-pixel is also in negative correlation with scattering intensity of each film layer in the pixel unit. Therefore, in an embodiment of the present disclosure, in order to make the interference intensity of the light emitted by the light-emitting layer of the sub-pixel of the target color 01a greater than that of the light emitted by the light-emitting layers of the sub-pixels of the other colors, as another optional implementation, it is also possible to provide scattering layers in the sub-pixels of the other colors other than the sub-pixel of the target color 01a. In this way, the color shifts of the sub-pixels of the other colors may be smaller and its luminance may be greater. So that the color displayed by the pixel unit and the colors observed at different angles have better consistency, and the display effect of the display panel is improved.

Figure 15:
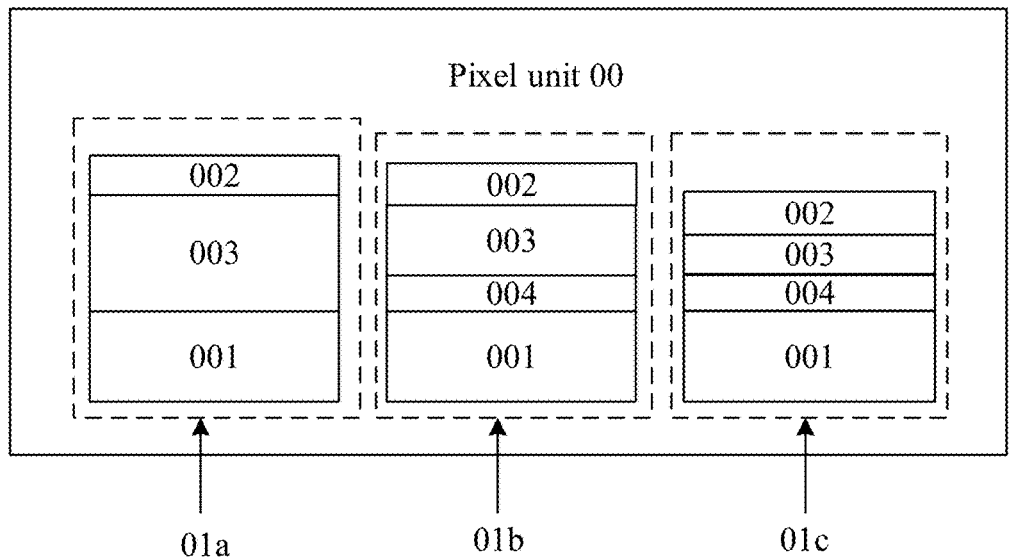
FIG. 15 is a schematic structural diagram of yet another pixel unit in accordance with an embodiment of the present disclosure.

FIG. 15 is a schematic structural diagram of yet another pixel unit in accordance with an embodiment of the present disclosure. It can be seen with reference to FIG. 15 that except the sub-pixel of the target color 01a, the sub-pixels of the other colors (e.g., the sub-pixel 01b and the sub-pixel 01c) may further each include: a scattering layer 004.

The scattering layer 004 may be disposed between the first electrode layer 001 and the light-emitting layer 003 and may be configured to scatter the light emitted by the light-emitting layer 003, so as to reduce the interference intensity of reflected light generated by repeatedly reflective light emitted by the light-emitting layer 003 between the first electrode layer 001 and the second electrode layer 002. That is, the microcavity intensities of the sub-pixels of the other colors may reduce.

Adding the scattering layer 004 to the sub-pixels of the other colors other than the sub-pixel of the target color 01a may reduce the microcavity gain factors of the sub-pixels of the other colors, such that the microcavity intensities of the sub-pixels of the other colors may reduce. After the scattering layer is added to the sub-pixels of the other colors, the microcavity intensities of the sub-pixels of the other colors may reduce, i.e., the interference intensity of light emitted by the light-emitting layers of the sub-pixels of the other colors is reduced. In this way, the color shifts of the sub-pixel of the other colors may be reduced and the luminance may be improved.

Figure 16:
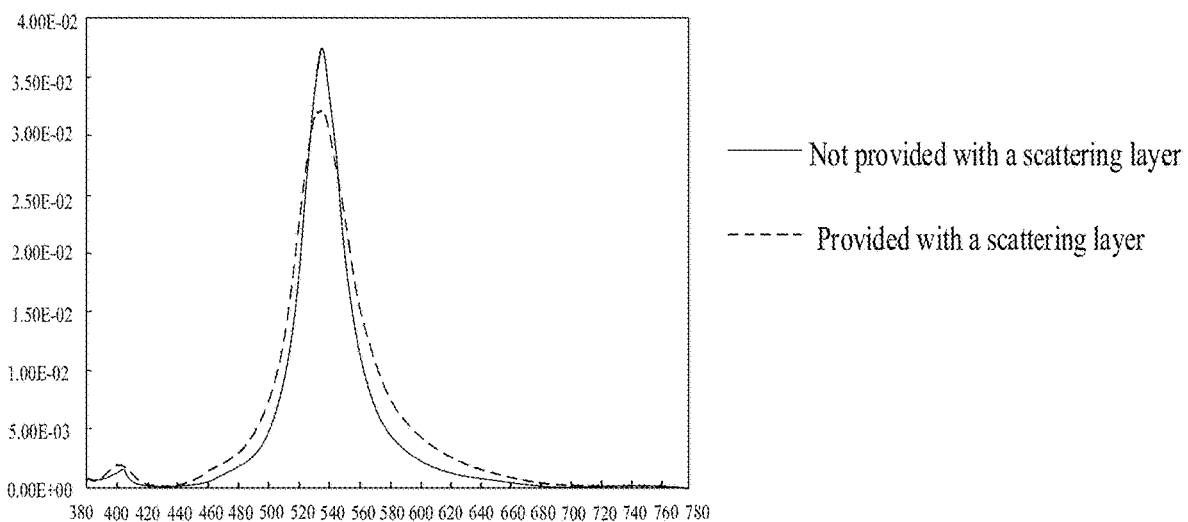
FIG. 16 is a graph showing another relationship between a microcavity gain factor and a wavelength in accordance with an embodiment of the present disclosure.

FIG. 16 is a graph showing another relationship between a microcavity gain factor and wavelength in accordance with an embodiment of the present disclosure. The horizontal axis represents the wavelength, which may be in nm; and the vertical axis represents the microcavity gain factor, which may be in a.u. FIG. 16 shows the relationship between the microcavity gain factor and the wavelength when the scattering layer is provided in the sub-pixel (i.e., after improvement) and when the scattering layer is not provided in the sub-pixel (i.e., before improvement), in which 2.00E-02 means 2.00 times 10 to the power of minus 2 (i.e., $2.00 \ast 10^{-2}$).

Referring to FIG. 16, when the wavelength is constant, the microcavity gain factor of the sub-pixel provided with the scattering layer is smaller than that of the sub-pixel not provided with the scattering layer. For example, as shown in FIG. 16, when the wavelength is 540 nm, the microcavity gain factor of the sub-pixel not provided with the scattering layer ranges from 3.50E-02 to 4.00E-02, and the microcavity gain factor of the sub-pixel provided with the scattering layer ranges from 3.00E-02 to 3.50E-02.

However, the microcavity intensity is in positive correlation with the microcavity gain factor, i.e., the greater the microcavity gain factor is, the greater the microcavity intensity is, and the smaller the microcavity gain factor is, the smaller the microcavity intensity is. Therefore, the microcavity gain factor of the sub-pixel may be reduced by providing the scattering layer in the sub-pixel, thereby reducing the microcavity intensity of the sub-pixel. That is, the interference intensity of the light emitted by the sub-pixel is reduced.

Figure 17:
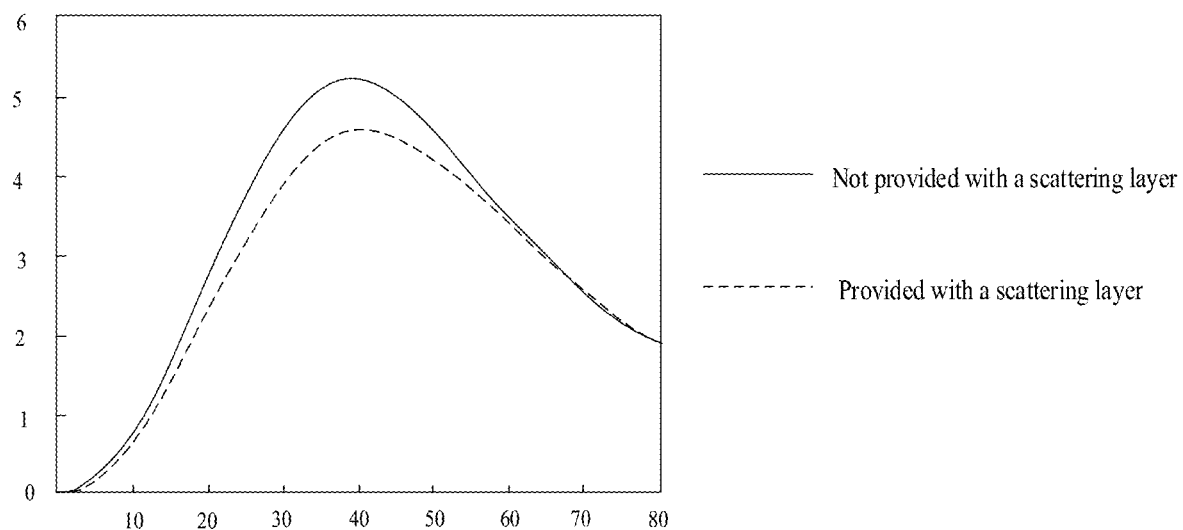
FIG. 17 is a graph showing another relationship between degree of color shift and a viewing angle in accordance with an embodiment of the present disclosure.

FIG. 17 is a graph showing another relationship between the degree of color shift and a viewing angle in accordance with an embodiment of the present disclosure. The horizontal axis represents the viewing angle, which may be in degree; the vertical axis represents the degree of color shift, which may be in JNCD. FIG. 17 shows the relationship between the degree of color shift and the viewing angle when the scattering layer is provided in the sub-pixel (that is, after improvement) and when the scattering layer is not provided (that is, before improvement), in which the viewing angle may range from 0 to 80°.

It can be seen with reference to FIG. 17 that when the viewing angle is constant, the color shift of the sub-pixel provided with the scattering layer is smaller, and the color shift of the sub-pixel not provided with the scattering layer is greater. For example, when the viewing angle is 40°, the color shift of the sub-pixel with the scattering layer ranges from 4 JNCD to 5 JNCD, and the color shift of the sub-pixel not provided with the scattering layer ranges from 5 JNCD to 6 JNCD. Therefore, in an embodiment of the present disclosure, the color shifts of the sub-pixels of the other colors may be reduced by adding the scattering layer to the sub-pixels of the other colors other than the sub-pixel of the target color 01a.

Figure 18:
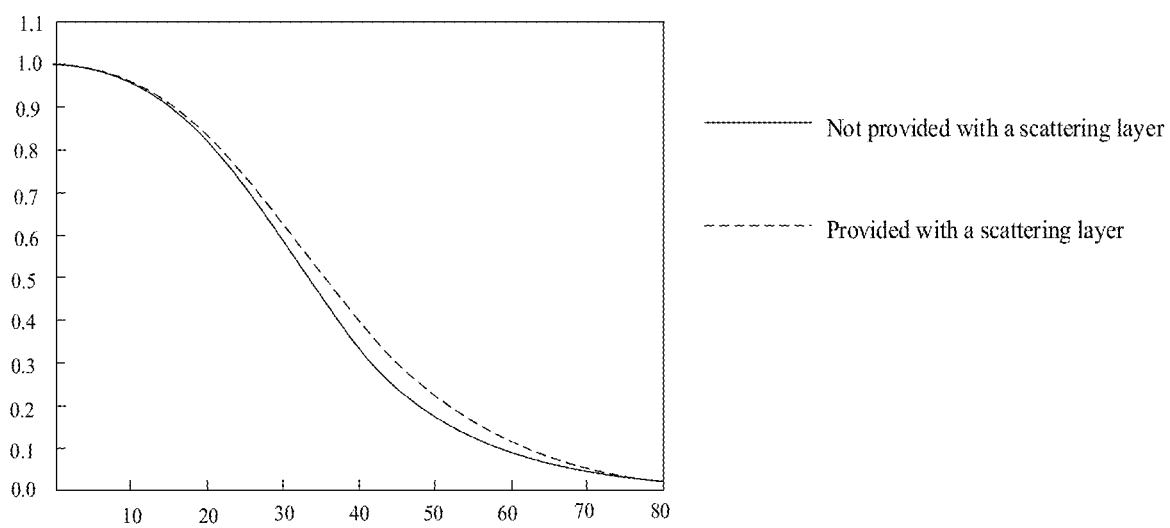
FIG. 18 is a graph showing another relationship between luminance of a sub-pixel and a viewing angle in accordance with an embodiment of the present disclosure.

FIG. 18 is a graph showing another relationship between luminance of a sub-pixel and a viewing angle in accordance with an embodiment of the present disclosure. The horizontal axis represents the viewing angle, which may be in degree; and the vertical axis represents the luminance. The luminance of the sub-pixel is in negative correlation with the microcavity intensity. FIG. 18 shows the relationship between the luminance of the sub-pixel and the viewing angle when the scattering layer is provided in the sub-pixel (i.e., after improvement) and when the scattering layer is not provided (i.e., before the improvement), in which the viewing angle ranges from 0 to 80°.

Referring to FIG. 18, when the viewing angle is constant, the luminance of the sub-pixel provided with the scattering layer is greater, and the luminance of the sub-pixel not provided with the scattering layer is lower. For example, when the viewing angle is 40°, the luminance of the sub-pixel provided with the scattering layer is greater than that of the sub-pixel not provided with the scattering layer. Therefore, in an embodiment of the present disclosure, the luminance of the sub-pixels of the other colors may be increased by adding a scattering layer to the sub-pixels of the other colors other than the sub-pixel of the target color 01a, such that the luminance of the displayed color is greater.

Figure 19:
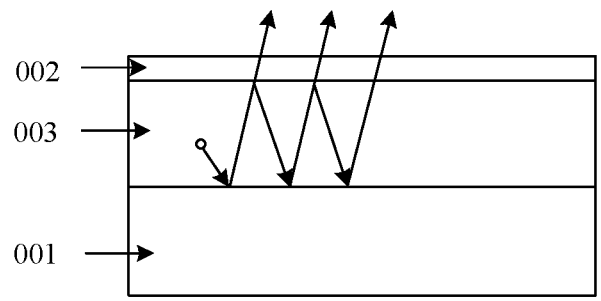
FIG. 19 is a schematic structural diagram of a sub-pixel not provided with a scattering layer.

FIG. 19 is a schematic structural diagram of a sub-pixel not provided with a scattering layer. It can be seen with reference to FIG. 19 that light emitted by the light-emitting layer 003 may be reflected by the first electrode layer 001 to the second electrode layer 002 and exit from the second electrode layer 002.

Figure 20:
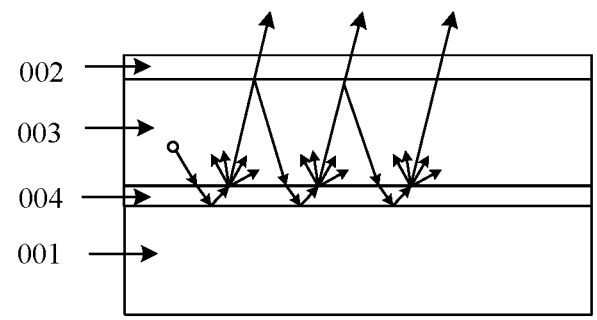
FIG. 20 is a schematic structural diagram of a sub-pixel provided with a scattering layer.

FIG. 20 is a schematic structural diagram of a sub-pixel provided with a scattering layer. Referring to FIG. 20, after the light emitted by the light-emitting layer 003 is incident onto the scattering layer 004, part of the light is scattered by the scattering layer 004, and the other part may be incident onto the first electrode layer 001 and further reflected by the first electrode layer 001 to the scattering layer 004. The scattering layer 004 may scatter the light again, part of the scattered light may exit from the second electrode layer 002, and the other part of the light may be reflected by the second electrode layer 002 to the light-emitting layer 003 again. Since the scattering layer 004 may scatter the light, the reflected light between the first electrode layer 001 and the second electrode layer 002 may be reduced. Thus, the interference intensity of the reflected light is reduced, i.e., the microcavity intensity of the sub-pixel is reduced.

Optionally, the scattering layer 004 may be made from carbon nanotubes (SWNT) or silver nano-ions (AgNWs). Silver (Ag) ions in the scattering layer 004 may weaken the interference intensity of the light emitted by the sub-pixel, i.e., may reduce the microcavity, intensity of the sub-pixel.

In an embodiment of the present disclosure, the sub-pixel of the target color 01a may be a red sub-pixel, the sub-pixel 01b may be a green sub-pixel, and the sub-pixel 01c may be a blue sub-pixel. In order to improve the display effect of the display panel, it is necessary to reduce the interference intensity of light emitted by the green sub-pixel and the blue sub-pixel. According to the above analysis, it can be known that, for reducing the interference intensity of the light emitted by the green sub-pixel and the blue sub-pixel, scattering layers may be added to the green sub-pixel and the blue sub-pixel respectively.

Figure 21:
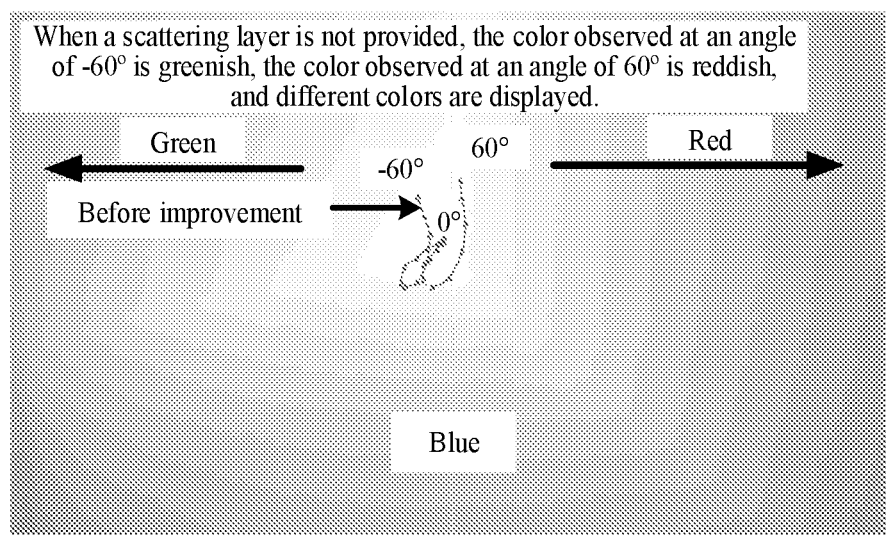
FIG. 21 is a schematic diagram showing a trajectory of changes of color shift with a viewing angle when none of sub-pixels in a pixel unit is provided with a scattering layer.

FIG. 21 is a schematic diagram showing a trajectory of changes of color shift with a viewing angle when none of sub-pixels in a pixel unit is provided with a scattering layer, i.e., a schematic diagram of a trajectory of changes of color shift of a pixel unit having unimproved asymmetry in color shift with a viewing angle. It can be seen with reference to FIG. 21 that when a scattering layer is not provided in the red sub-pixel 01a, the green sub-pixel 01b, or the blue sub-pixel 01c, a color observed by the human eyes in a direction that forms an angle of −60° with the datum line is greenish, and a color observed by the human eyes in a direction that forms an angle of 60° with the datum line is reddish. That is, when the human eyes observe at different angles, the observed colors are poor in consistency, and there exists the problem of asymmetry in color shift asymmetry. As a result, the display effect of the display panel is poor.

Figure 22:
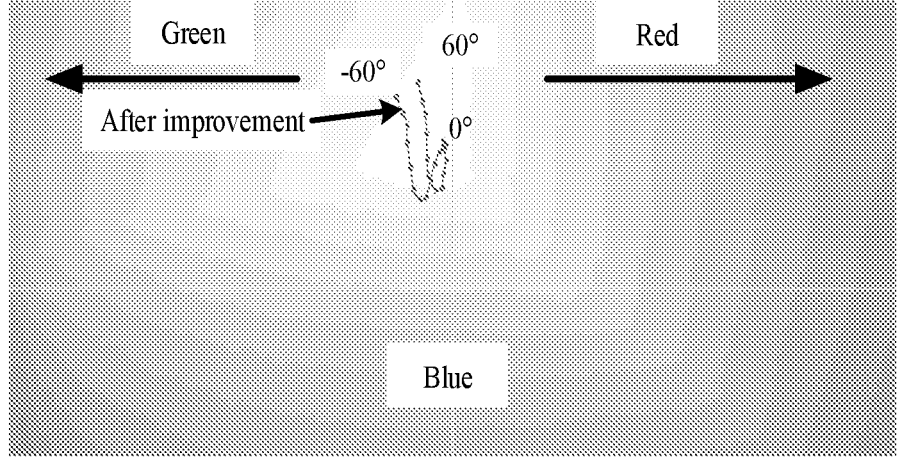
FIG. 22 is a schematic diagram showing a trajectory of changes of color shift with a viewing angle when scattering layers are disposed in a green sub-pixel and a blue sub-pixel in a pixel unit.

FIG. 22 is a schematic diagram of a trajectory of changes of color shift with a viewing angle when scattering layers are provided in a green sub-pixel and a blue sub-pixel in a pixel unit, i.e., a schematic diagram of a trajectory of changes of color shift of a pixel unit having improved asymmetry in color shift. Referring to FIG. 22, when scattering layers are provided in the green sub-pixel 01b and the blue sub-pixel 01c respectively, the colors observed by the human eyes in the directions that form angles of −60° and 60° with the datum line are all greenish. That is, when the human eyes observe at different angles, the observed colors are better in consistency. Thus, the problem of asymmetry in color shift is solved, and the display effect of the display panel is better.

Figure 23:
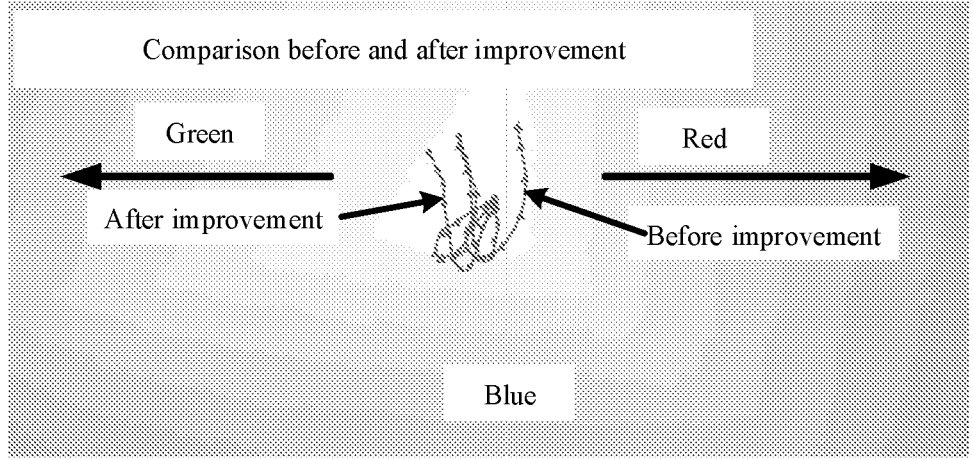
FIG. 23 is a schematic diagram showing comparison between trajectories of changes of color shift with a viewing angle before and after improvement of a pixel unit.

FIG. 23 is a schematic diagram showing a comparison between trajectories of changes of color shift with a viewing angle before and after improvement of the pixel unit. Referring to FIG. 23, when scattering layers are provided in the green sub-pixel 01b and the blue sub-pixel 01c, a ratio of the color displayed by the red sub-pixel 01a to the color displayed by the pixel unit is reduced, and the colors observed by the human eyes at different angles are all greenish. In this way, although color shift still exists in the pixel unit, the display panel has a better display effect because the problem of asymmetry in color shift of the pixel unit is solved.

Figure 24:
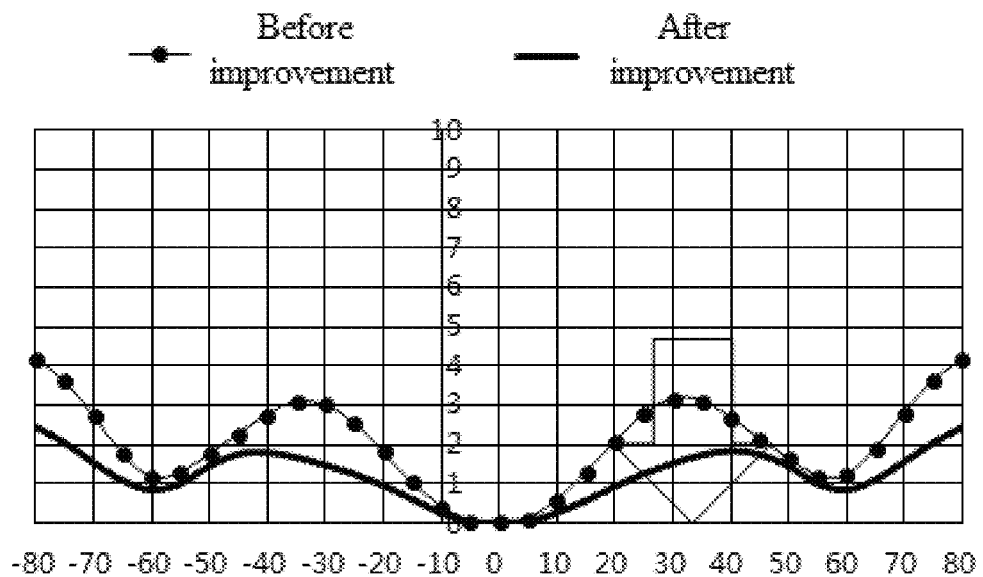
FIG. 24 is a graph showing a relationship between color shift of a green sub-pixel and a viewing angle in accordance with an embodiment of the present disclosure.

FIG. 24 is a graph showing a relationship between color shift of a green sub-pixel and a viewing angle in accordance with an embodiment of the present disclosure. The horizontal axis represents the viewing angle, and the vertical axis represents the degree of color shift. The degree of color shift is represented by the unit of JNCD. Referring to FIG. 24, when a scattering layer is provided in the green sub-pixel (i.e., after improvement color shift of the green sub-pixel 01b tends to decrease on the whole when the viewing angle ranges from −80° to 80°. That is, when the viewing angle ranges from −80° to 80°, a ratio of the color displayed by the green sub-pixel to the color displayed by the pixel unit is increased.

Figure 25:
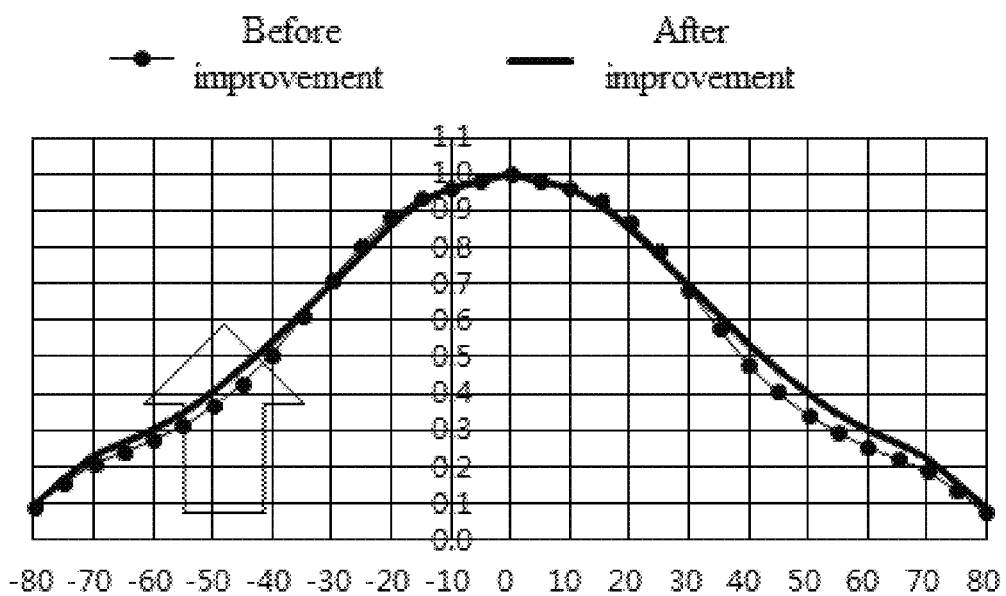
FIG. 25 is a graph showing a relationship between luminance of a green sub-pixel and a viewing angle in accordance with an embodiment of the present disclosure.

FIG. 25 is a graph showing a relationship between luminance of a green sub-pixel and a viewing angle in accordance with an embodiment of the present disclosure. The horizontal axis represents the viewing angle, and the vertical axis represents the luminance. Referring to FIG. 25, when a scattering layer is provided in the green sub-pixel 01b (i.e., after improvement), the luminance of the green sub-pixel is increased when the viewing angle ranges from −80° to 80°. That is, the influence on the color displayed by the pixel unit from the color displayed by the green sub-pixel is increased.

Figure 26:
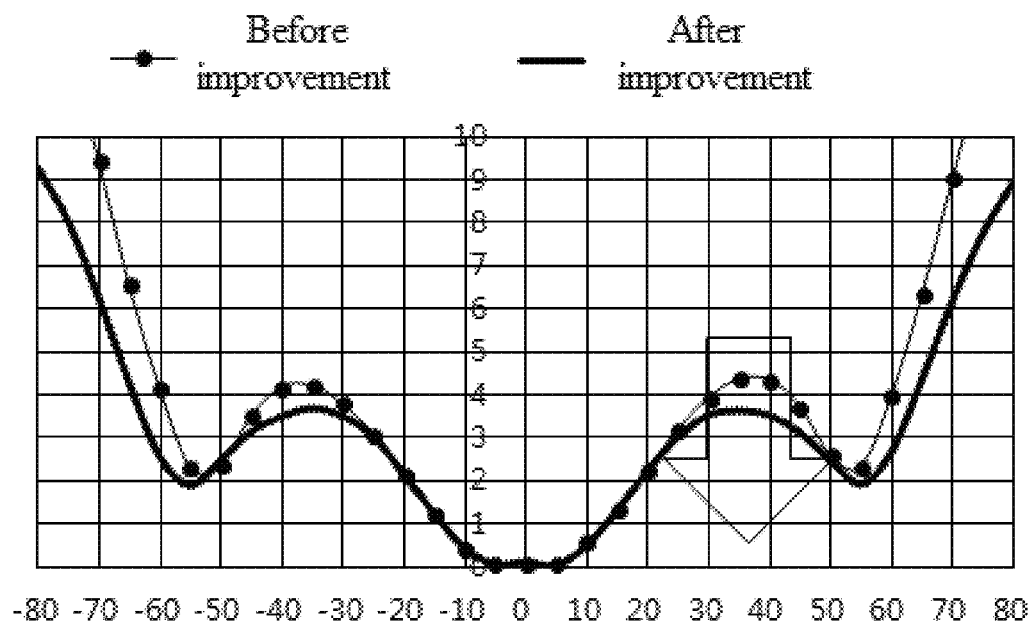
FIG. 26 is a graph showing a relationship between color shift of a blue sub-pixel and a viewing angle in accordance with an embodiment of the present disclosure.

FIG. 26 is a graph showing a relationship between color shift of a blue sub-pixel and a viewing angle in accordance with an embodiment of the present disclosure. The horizontal axis represents the viewing angle, and the vertical axis represents the degree of color shift. The degree of color shift is represented in the unit of JNCD. Referring to FIG. 26, when a scattering layer is provided in the blue sub-pixel (i.e., after improvement), the color shift of the blue sub-pixel 01c tends to decrease on the whole when the viewing angle ranges from −80° to 80°, That is, when the viewing angle ranges from −80° to 80°, a ratio of the color di splayed by the blue sub-pixel to the color displayed by the pixel unit is increased.

Figure 27:
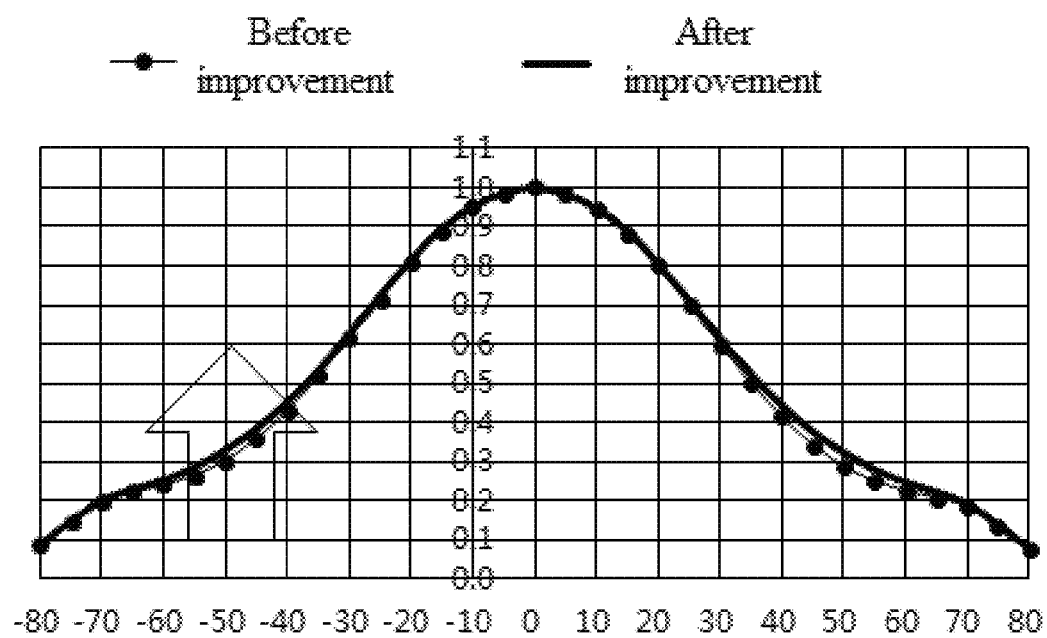
FIG. 27 is a graph showing a relationship between luminance of a blue sub-pixel and a viewing angle in accordance with an embodiment of the present disclosure.

FIG. 27 is a graph showing a relationship between luminance of a blue sub-pixel and a viewing angle in accordance with an embodiment of the present disclosure. The horizontal axis represents the viewing angle, and the vertical axis represents the luminance. Referring to FIG. 27, when a scattering layer is provided in the blue sub-pixel 01c (i.e., after improvement), the luminance of the blue sub-pixel is increased when the viewing angle ranges from −80° to 80°. That is, the influence on the color displayed by the pixel unit from the color displayed by the blue sub-pixel 01c is increased.

Table 1 shows color shifts observed at different angles before and after improvement. The greater the value of the color shift is, the more serious the color shift is. It can be seen from Table 1 that at the viewing angle of 30°, the value of the color shift before improvement is 4.2, and the value of the color shift after improvement is 2.8; at the viewing angle of 45°, the value of the color shift before improvement is 4.2, and the value of the color shift after improvement is 2.0; and at the viewing angle of 60°, the value of the color shift before improvement is 1.3, and the value of the color shift after improvement is 3.3. It thus can be seen that the color shift of the pixel unit provided by the embodiment of the present disclosure is small, and the display effect is excellent.

TABLE 1

| Angle | 30° | 45° |
| --- | --- | --- |
| Color shift after improvement | 2.8 | 2.0 |
| Color shift before improvement | 4.2 | 4.2 |

Optionally, in an embodiment of the present disclosure, the interference intensity of light emitted by the light-emitting layer of the sub-pixel of the target color 01a may also be increased while the interference intensity of the light emitted by the light-emitting layers of the sub-pixels of the other colors (the sub-pixel 01b and the sub-pixel 01c) is reduced. For example, the cathode layer 002 of the sub-pixel of the target color 01a may be thickened, meanwhile the scattering layer 004 may be added to the sub-pixels of the other colors.

Figure 28:
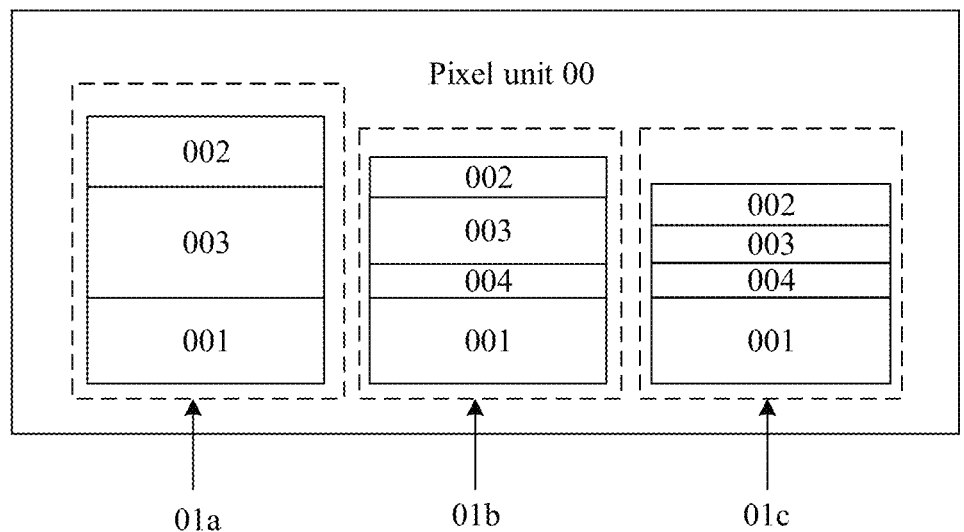
FIG. 28 is a schematic structural diagram of still another pixel unit in accordance with an embodiment of the present disclosure.

Exemplarily, FIG. 28 is a schematic structural diagram of yet another pixel unit in accordance with an embodiment of the present disclosure. It can be seen with reference to FIG. 28 that the second electrode layer 002 in the sub-pixel of the target color 01a is thicker than the second electrode layers 002 in the sub-pixels of the other colors. In addition, a scattering layer 004 may be provided in the sub-pixels of the other colors. In the pixel unit shown in FIG. 28, the interference intensity of light emitted by the light-emitting layer of the sub-pixel of the target color 01*a* is increased by thickening the cathode layer 002 of the sub-pixel of the target color 01*a*, that is, the microcavity intensity of the sub-pixel of the target color 01*a* is increased, such that the color shift of the sub-pixel of the target color 01*a* is increased and its luminance is reduced. Further, the influence on the color displayed by the pixel unit from the color displayed by the sub-pixel of the target color 01*a* is reduced (i.e., a ratio of the color displayed by the sub-pixel of the target color 01*a* is reduced). Meanwhile, providing scattering layers 004 in the sub-pixels of the other colors (the sub-pixel 01*b* and the sub-pixel 01*c*) may reduce the interference intensity of the light emitted by the light-emitting layers of the sub-pixels of the other colors, i.e., may reduce the microcavity intensity of the sub-pixel of the other colors, such that the color shifts of the sub-pixels of the other colors may be reduced, its luminance may be improved, and the influence on the color displayed by the pixel unit from the color displayed by the sub-pixels of the other colors is increased (i.e., the ratio of the color displayed by the sub-pixels of the other colors is increased). Therefore, the colors of the pixel unit observed at different angles may be made consistent. Thus, the problem of asymmetry in color shift is solved, and the display effect of the display panel is improved.

Figure 29:
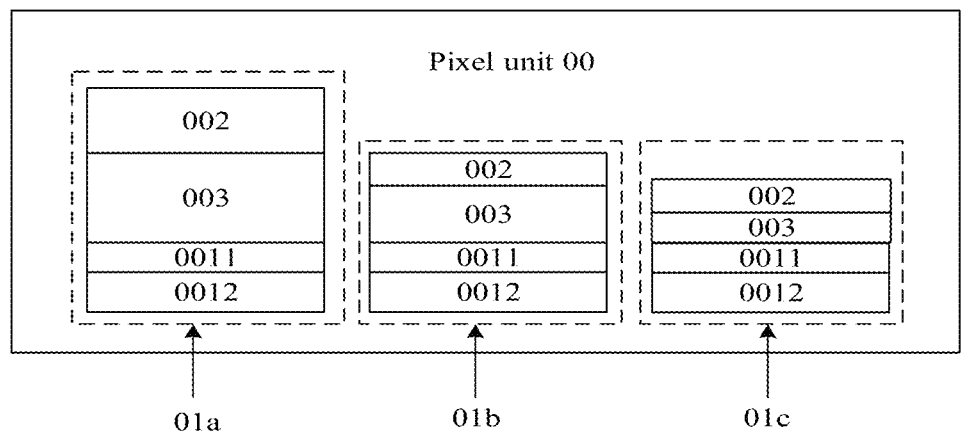
FIG. 29 is a schematic structural diagram of still yet another pixel unit in accordance with an embodiment of the present disclosure.

FIG. 29 is a schematic structural diagram of still yet another pixel unit in accordance with an embodiment of the present disclosure. It can be seen with reference to FIG. 29 that the first electrode layer 001 may include a transparent electrode layer 0011 and a reflective metal layer 0012, and the transparent electrode layer 0011 may be disposed between the reflective metal layer 0012 and the light-emitting layer 003.

The transparent electrode layer 0011 and the second electrode layer 002 may jointly drive the light-emitting layer 003 to emit light, and the light emitted by the light-emitting layer 003 may be reflected by the reflective metal layer 0012 to the second electrode layer 002 after striking the reflective metal layer 002, and may be emitted from the second electrode layer 002.

Optionally, the second electrode layer 002 may be made of metal or metal alloy. The metal may be silver, aluminum, magnesium or calcium, and the metal alloy may be magnesium silver, etc.

In an embodiment of the present disclosure, the transparent electrode layer 0011 may have a thickness of 5 nm to 15 nm. The reflective metal layer 0012 may have a thickness of 90 nm to 110 nm. The transparent electrode layer 0011 may be made from an indium tin oxide (ITO). The reflective metal layer 0012 may be made of a metal or a metal alloy. The metal may be silver, aluminum, magnesium, calcium, or lithium, and the metal alloy may be magnesium silver, magnesium aluminum, magnesium calcium, etc.

It can be seen with reference to FIGS. 3, 4, 28 and 29 that the light-emitting layer 003 in the red sub-pixel 01*a* may be thicker than the light-emitting layer 003 in the green sub-pixel 01*b*, and the light-emitting layer 003 in the green sub-pixel 01*b* may be thicker than the light-emitting layer 003 in the blue sub-pixel 01*c*.

Optionally, the light-emitting layer 003 of the red sub-pixel 01*a* may have a thickness of 240 nm to 260 nm, e.g., 250 nm, the light-emitting layer 003 of the green sub-pixel 01*b* may have a thickness of 200 n to 220 nm, e.g., 210 nm, and the light-emitting layer 003 of the blue sub-pixel O1e may have a thickness of 160 nm to 180 nm, e.g., 170 nm.

Figure 30:
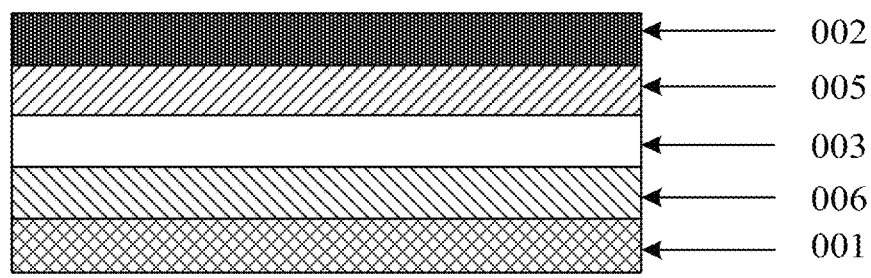
FIG. 30 is a schematic structural diagram of a sub-pixel in accordance with an embodiment of the present disclosure.

FIG. 30 is a schematic structural diagram of a sub-pixel in accordance with an embodiment of the present disclosure.

As can be seen with reference to FIG. 30, the sub-pixel may further include an electron transport layer (ETL) 005 and a hole transport layer (HTL) 006.

The ETL 005 may be disposed between the second electrode layer 002 and the light-emitting layer 003 and may be configured to receive electrons emitted by the second electrode layer 002 and to transport the received electrons to the light-emitting layer 003. The ETL 005 has high electron conductivity, and can transport the electrons generated by the second electrode layer 002 to the light-emitting layer 003 quickly, thereby increasing the electron transport rate.

Optionally, the ETL 005 may be made from such materials as metal organic complexes or o-phenanthroline (1,10-Phenanthroline monohydrate), and may have a thickness of 20 nm to 40 nm. For example, the ETL 005 may have a thickness of 29 nm.

The HTL 006 may be disposed between the light-emitting layer 003 and the first electrode layer 001 and configured to receive holes injected by the first electrode layer 001 and to transport the received holes to the light-emitting layer 003. The HTL 006 has high hole conductivity, and can quickly transport the holes generated by the first electrode layer 001 to the light-emitting layer 003, thereby increasing the hole transport rate.

Optionally, the HTL 006 may be made from a triarylamine-based material and may have a thickness of 50 nm to 150 nm. For example, the HTL 006 may have a thickness of 65 nm, 79 nm, 105 nm, 140 nm, etc.

Optionally, the light-emitting layer 003 may be made from an organic material, and the light-emitting layers in the sub-pixels of different colors are made from different materials.

In an embodiment of the present disclosure, the ETLs 005 in the red sub-pixel 01*a*, the green sub-pixel 01*b* and the blue sub-pixel 01*c* may have the same thickness. Furthermore, the light-emitting layers 003 in the red sub-pixel 01*a*, the green sub-pixel 01*b*, and the blue sub-pixel 01*c* may also have the same thickness. The HTL 006 in the red sub-pixel 01*a* is thicker than the HTL 006 in the green sub-pixel 01*b*. The HTL 006 in the green sub-pixel 01*b* is thicker than the HTL 006 in the blue sub-pixel 01*c*.

Exemplarily, the ETLs 005 in the red sub-pixel 01*a*, the green sub-pixel 01*b*, and the blue sub-pixel 01*c* may have the same thickness of 35 nm. The light-emitting layers 003 in the red sub-pixel 01*a*, the green sub-pixel 01*b*, and the blue sub-pixel 01*c* may have the same thickness of 40 nm. The HTL 006 in the red sub-pixel 01*a* may have a thickness of 150 nm, the HTL 006 in the green sub-pixel 01*b* may have a thickness of 120 nm, and the HTL, 006 in the blue sub-pixel 01*c* may have a thickness of 90 nm.

In summary, according to the pixel unit provided by the embodiments of the present disclosure, in the plurality of sub-pixels of different colors, the interference intensity of light emitted by the light-emitting layer of the sub-pixel of the target color is greater than that of light emitted by light-emitting layers of the sub-pixels of the other colors, such that the color shift of the sub-pixel of the target color may be increased, and the ratio of the color displayed by the sub-pixel of the target color to the color displayed by the pixel unit is reduced. In this way, when observed by the human eyes at different angles, the colors displayed by the pixel unit are all approximate to the color displayed by the sub-pixels of the other colors. Therefore, the observed colors are excellent in consistency, which effectively solves the problem of asymmetry in color shift. Moreover, a display effect of the display panel is improved by adjusting the interference intensity of light emitted by the sub-pixels of different colors. Thus, the manufacturing process is reduced in difficulty and color gamut will not be adversely affected.

Figure 31:
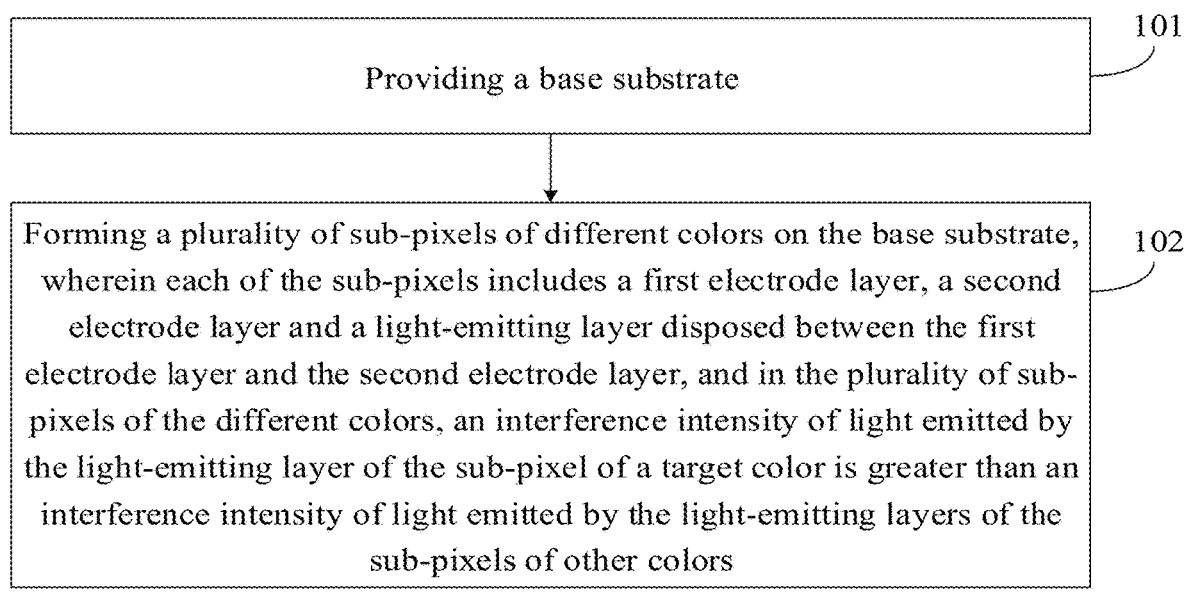
FIG. 31 is a flowchart of a method for manufacturing a pixel unit in accordance with an embodiment of the present disclosure.

An embodiment of the present disclosure further provides a method for manufacturing a pixel unit, which may be used for manufacturing the pixel unit provided by the aforementioned embodiment. As shown in FIG. 31, the method may include:

In step 101, a base substrate is provided.

In step 102, a plurality of sub-pixels of different colors is formed on the base substrate. Each of the sub-pixels includes a first electrode layer, a second electrode layer and a light-emitting layer disposed between the first electrode layer and the second electrode layer. In the plurality of sub-pixels of different colors, an interference intensity of light emitted by the light-emitting layer of a sub-pixel of the target color is greater than the interference intensity of light emitted by the light-emitting layers of sub-pixels of the other colors.

The interference intensity means an interference intensity between reflected light produced when light emitted by the light-emitting layer is frequently reflected between the first electrode layer and the second electrode layer.

Optionally, for each of the sub-pixels, the interference intensity of the light emitted by the light-emitting layer is in positive correlation with a thickness of the second electrode layer, and the second electrode layer of the sub-pixel of the target color is thicker than the second electrode layers of the sub-pixels of the other colors.

Optionally, the second electrode layer may be a cathode layer, and the cathode layer of the sub-pixel of the target color may include a first cathode sub-layer and a second cathode sub-layer which are sequentially laminated in a direction distal from the light-emitting layer.

As an optional implementation, in step 102, the first cathode sub-layer and the cathode layers of the sub-pixels of the other colors may be formed by one patterning process. That is, the first cathode sub-layer and the cathode layers of the sub-pixels of the other colors may be formed on the same layer and have the same thickness. After that, the second cathode sub-layer may be formed on the side, distal from the light-emitting layer, of the first cathode sub-layer by the patterning process. Thus, the cathode layer of the sub-pixel of the target color may be thicker than the cathode layers of the sub-pixels of the other colors.

As another optional implementation mode, in step 102, the cathode layer of the sub-pixel of the target color and the cathode layers of the sub-pixels of the other colors may be respectively formed by two patterning processes. For example, the cathode layer of the sub-pixel of the target color is formed by a first patterning process, and the cathode layers of the sub-pixels of the other colors may be formed by a second patterning process, such that the cathode layers of the two have different thicknesses. Certainly, the order of the first patterning process and the second patterning process may be adjusted, which will not be limited in the embodiments of the present disclosure.

In summary, according to the method for manufacturing the pixel unit provided by the present embodiment, in the plurality of sub-pixels of different colors, included by the pixel unit manufactured by the method, the interference intensity of light emitted by the light-emitting layer of the sub-pixel of the target color is greater than that of light emitted by light-emitting layers of the sub-pixels of the other colors, such that the color shift of the sub-pixel of the target color may be increased, and the ratio of the color displayed by the sub-pixel of the target color to the color displayed by the pixel unit is reduced. In this way, when observed by the human eyes at different angles, the colors displayed by the pixel unit are all approximate to the color displayed by the sub-pixels of the other colors. Therefore, the observed colors are excellent in consistency, which effectively solves the problem of asymmetry in color shift. Moreover, a display effect of the display panel is improved by adjusting the interference intensity of light emitted by the sub-pixels of different colors. Thus, the manufacturing process is reduced in difficulty and color gamut will not be adversely affected.

An embodiment of the present disclosure further provides a display panel that may include at least one of the pixel unit as defined in the aforementioned embodiments.

Optionally, the display panel may include a plurality of pixel units arranged in an array, and each pixel unit may be the pixel unit as defined in the aforementioned embodiments.

An embodiment of the present disclosure further provides a display device, which may include the display panel as defined in the aforementioned embodiment and a driving circuit for the display panel.

Optionally, the display device may be any product or component having a display function, such as electronic paper, an OLED display device, an active matrix/organic light emitting diode (AMOLED) display device, a mobile phone, a tablet computer, a television, a display, a notebook computer, a digital photo frame or a navigator.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A pixel unit, comprising a plurality of sub-pixels of different colors comprising a red sub-pixel, a green sub-pixel and a blue sub-pixel, wherein each of the sub-pixels comprises a first electrode layer, a second electrode layer, and a light-emitting layer disposed between the first electrode layer and the second electrode layer, the second electrode layer being a cathode layer;

in the plurality of sub-pixels of the different colors, an interference intensity of light emitted by the light-emitting layer of the sub-pixel of a target color is greater than an interference intensity of light emitted by the light-emitting layers of the sub-pixels of other colors, the sub-pixel of the target color being the red sub-pixel; and the second electrode layer of the sub-pixel of the target color is thicker than the second electrode layers of the sub-pixels of the other colors, wherein the sub-pixels of the other colors further each comprise a scattering layer, and the scattering layer is disposed between the first electrode layer and the light-emitting layer and configured to scatter the light emitted by the light-emitting layer;

wherein the interference intensity means an interference intensity between reflected light produced when light emitted by the light-emitting layer of the sub-pixel is frequently reflected between the layers of the sub-pixel, the interference intensity of the light emitted by the light-emitting layer of each of the sub-pixels being in positive correlation with a thickness of the second electrode layer, being in positive correlation with a degree of color shift of the sub-pixel, and being in negative correlation with a scattering intensity of each film layer in the pixel unit.

2. The pixel unit according to claim 1, wherein the thickness of the cathode layer of the sub-pixel of the target color ranges from 20 nm to 30 nm; and the thicknesses of the cathode layers of the sub-pixels of the other colors range from 8 nm to 18 nm.

3. The pixel unit according to claim 1, wherein the cathode layer of the sub-pixel of the target color comprises a first cathode sub-layer and a second cathode sub-layer which are sequentially laminated in a direction distal from the light-emitting layer;

wherein the first cathode sub-layer and the cathode layers of the sub-pixels of the other colors are disposed on a same layer and have a same thickness.

4. The pixel unit according to claim 1, wherein the scattering layer is made from carbon nanotubes and silver nano-ions.

5. The pixel unit according to claim 1, wherein the first electrode layer comprises a transparent electrode layer and a reflective metal layer, wherein the transparent electrode layer is disposed between the reflective metal layer and the light-emitting layer.

6. The pixel unit according to claim 5, wherein the transparent electrode layer is made from an indium tin oxide, and the reflective metal layer is made of a metal or a metal alloy.

7. The pixel unit according to claim 5, wherein a thickness of the transparent electrode layer ranges from 5 nm to 15 nm, and a thickness of the reflective metal layer ranges from 90 nm to 110 nm.

8. The pixel unit according to claim 1, wherein the light-emitting layer in the red sub-pixel is thicker than the light-emitting layer in the green sub-pixel, and the light-emitting layer in the green sub-pixel is thicker than the light-emitting layer in the blue sub-pixel.

9. The pixel unit according to claim 1, wherein each of the sub-pixels further comprises an electron transport layer and an hole transport layer;

wherein the electron transport layer is disposed between the second electrode layer and the light-emitting layer; and the hole transport layer is disposed between the light-emitting layer and the first electrode layer.

10. A method for manufacturing a pixel unit, comprising:
providing a base substrate; and
forming a plurality of sub-pixels of different colors on the base substrate; wherein the plurality of sub-pixels of the different colors comprise a red sub-pixel, a green sub-pixel and a blue sub-pixel, and each of the sub-pixels comprises a first electrode layer, a second electrode layer, and a light-emitting layer disposed between the first electrode layer and the second electrode layer, the second electrode layer being a cathode layer, and in the plurality of sub-pixels of the different colors, an interference intensity of light emitted by the light-emitting layer of the sub-pixel of a target color is greater than an interference intensity of light emitted by the light-emitting layers of the sub-pixels of other colors, the sub-pixel of the target color being the red sub-pixel;

wherein the second electrode layer of the sub-pixel of the target color is thicker than the second electrode layers of the sub-pixels of the other colors, the sub-pixels of the other colors further each comprise a scattering layer, and the scattering layer is disposed between the first electrode layer and the light-emitting layer and configured to scatter the light emitted by the light-emitting layer; and the interference intensity means an interference intensity between reflected light produced when light emitted by the light-emitting layer of the sub-pixel is frequently reflected between the layers of the sub-pixel, the interference intensity of the light emitted by the light-emitting layer of each of the sub-pixels being in positive correlation with a thickness of the second electrode layer, being in positive correlation with a degree of color shift of the sub-pixel, and being in negative correlation with a scattering intensity of each film layer in the pixel unit.

11. The method according to claim 10, wherein the cathode layer of the sub-pixel of the target color comprises a first cathode sub-layer and a second cathode sub-layer which are sequentially laminated in a direction distal from the light-emitting layer;

wherein the first cathode sub-layer and the cathode layers of the sub-pixels of the other colors are formed by one patterning process.

12. The method according to claim 10, wherein
the cathode layer of the sub-pixel of the target color and the cathode layer of the sub-pixel of the other colors are respectively formed two patterning processes.

13. A display panel, comprising at least one pixel unit;
wherein the pixel unit comprises a plurality of sub-pixels of different colors comprising a red sub-pixel, a green sub-pixel and a blue sub-pixel, wherein each of the sub-pixels comprises a first electrode layer, a second electrode layer, and a light-emitting layer disposed between the first electrode layer and the second electrode layer, the second electrode layer being a cathode layer;

in the plurality of sub-pixels of the different colors, an interference intensity of light emitted by the light-emitting layer of the sub-pixel of a target color is greater than an interference intensity of light emitted by the light-emitting layers of the sub-pixels of other colors, the sub-pixel of the target color being the red sub-pixel; and the second electrode layer of the sub-pixel of the target color is thicker than the second electrode layers of the sub-pixels of the other colors, wherein the sub-pixels of the other colors further each comprise a scattering layer, and the scattering layer is disposed between the first electrode layer and the light-emitting layer and configured to scatter the light emitted by the light-emitting layer;

wherein the interference intensity means an interference intensity between reflected light produced when light emitted by the light-emitting layer of the sub-pixel is frequently reflected between the layers of the sub-pixel, the interference intensity of the light emitted by the light-emitting layer of each of the sub-pixels being in positive correlation with a thickness of the second electrode layer, being in positive correlation with a degree of color shift of the sub-pixel, and being in negative correlation with a scattering intensity of each film layer in the pixel unit.

14. The display panel according to claim 13, comprising a plurality of the pixel units arranged in an array.

15. A display device, comprising the display panel as defined in claim 13 and a driving circuit for the display panel.

* * * * *